United States Patent [19]

Behrens et al.

[11] Patent Number: 5,291,499

[45] Date of Patent: Mar. 1, 1994

[54] METHOD AND APPARATUS FOR REDUCED-COMPLEXITY VITERBI-TYPE SEQUENCE DETECTORS

[75] Inventors: Richard T. Behrens, Louisville; Kent D. Anderson, Lafayette; Neal Glover, Broomfield, all of Colo.

[73] Assignee: Cirrus Logic, Inc., Fremont, Calif.

[21] Appl. No.: 852,015

[22] Filed: Mar. 16, 1992

[51] Int. Cl.[5] .............................................. G06F 11/00
[52] U.S. Cl. ...................................................... 371/43
[58] Field of Search ...................... 371/43, 44, 45, 46, 371/17, 34, 39

[56] References Cited

U.S. PATENT DOCUMENTS 5,042,036  8/1991  Fettweis ................................ 371/43
5,068,859  11/1991  Collins et al. ......................... 371/43

OTHER PUBLICATIONS

*A New Type of Viterbi Decoding with Path Reduction* Yashima et al. Conference paper presented at Globecom '89 IEEE Global Telecommunications Conference and Exhibition ©1989 IEEE pp. 1714–1718.

Tor Aulin, "Asymptotically Optimal Joint Channel Equalization, Demodulation, and Channel Decoding With Minimal Complexity And Delay," Coded Modulation And Bandwidth-Efficient Transmission, Elsevier Science Publishers B.V., 1992.

Sedat Olcer, "Reduced-State Sequence Detection of Multilevel Partial-Response Signals," IEEE Trans. on Comm., v. 40, No. 1, Jan. 1992.

Tor Aulin, "Application of the SA(B) Detection Algorithm to Coded-PSK Modulation," Chalmers University of Technology Division of Information Theory Tech. Rep., Dec. 1991.

A. Svensson, "Reduced State Sequence Detection Of Partial Response Continuous Phase Modulation," IEE Proceedings-I, v. 138, No. 4, Aug. 1991.

Torbjorn Larsson, "A State-Space Partitioning Approach To Trellis Decoding," Chalmers University of Technology School of Electrical and Computer Engineering Tech. Rep. No. 222, 1991.

M. V. Eyuboglu, S. U. Qureshi, and M. P. Chen, "Reduced-State Sequence Estimation For Coded Modulation On Intersymbol Interference Channels," IEEE J. Select. Areas Comm. vol. 6, Aug. 1989.

(List continued on next page.)

*Primary Examiner*—Vincent P. Canney
*Attorney, Agent, or Firm*—Blakely, Sokoloff, Taylor & Zafman

[57] ABSTRACT

A Viterbi detector is modified to reduce its implementation complexity. A partial-response signal may be viewed as a sequence of expected samples generated from a finite-state-machine model. In a typical Viterbi demodulator implemented using the add, compare, select (ACS) method, each state in the expected sample sequence model is associated with a hardware module to perform the functions of adding new branch error metrics to path error metrics, comparing path error metrics, and selecting the path having the lowest path error metric. In this invention, an ACS module may have two or more sequence-model states dynamically associated with it, such that at some times one sequence-model state is associated with it and at other times another sequence-model state is associated with it. This reduces the number of ACS modules required and also reduces the size/complexity of the demodulator's path memories which must store one path for each ACS module. Groups of sequence-model states may be chosen to share an ACS module without significant loss in performance as compared to the original, unreduced Viterbi demodulator. The invention supports a wide range of sample models by making the expected sample sequence of an isolated medium transition programmable. The invention reduces the speed at which the detector circuitry must operate relative to the sample rate by allowing multiple samples to be processed simultaneously. Several reduced detectors for specific sample sequence models are presented for particular applications. The invention is applicable to other types of Viterbi detectors, such as decoders for convolutional codes.

29 Claims, 34 Drawing Sheets

OTHER PUBLICATIONS

A. Duel-Hallen and C. Heegard, "Delayed Decision-Feedback Sequence Estimation," IEEE Trans. on Comm., vol. 37, May 1989.

M. V. Eyuboglu and S. U. Qureshi, "Reduced-State Sequence Estimation With Set Partitioning And Decision Feedback," IEEE Trans. on Comm., v. 36, Jan. 1988.

Takeshi Hashimoto, "A List-Type Reduced Constraint Generalization of The Viterbi Algorithm," IEEE Trans. Info. Theory, vol. IT-33, No. 6, Nov. 1987.

Tor Aulin, "Study Of A New Trellis Decoding Algorithm And Its Applications," Chalmers University of Technology Division of Information Theory Tech. Rep., Dec. 1985.

Arne Svensson, Carl-Erik Sundberg, and Tor Aulin, "A Class of Reduced-Complexity Viterbi Detectors for Partial Response Continuous Phase Modulation," IEEE Trans. on Comm., v. COM-32, No. 10, Oct., 1984.

Stanley J. Simmons and Paul H. Wittke, "Low Complexity Decoders for Constant Envelope Digital Modulations," IEEEE Trans. on Comm., v. COM-31, No. 12, Dec. 1983.

METHOD AND APPARATUS FOR REDUCED-COMPLEXITY VITERBI-TYPE SEQUENCE DETECTORS

BACKGROUND OF THE INVENTION

1. Field of the Invention

This invention relates generally to detection, demodulation and decoding of digital information in data storage and/or communication systems, and to the efficient implementation of such circuits. More particularly, the invention relates to sequence-based demodulation of partial-response signals and to sequence-based decoding of convolutional codes using a Viterbi-like algorithm.

2. Prior Art

In the storage or transmission of digital information, the bits or symbols of the user data are actually transmitted or stored via a physical medium or mechanism whose responses are essentially analog in nature. The analog write or transmit signal going into the storage/transmission medium or channel is typically modulated by channel bits that are an encoded version of the original user-data bits. The analog read or receive signal coming from the medium is demodulated to detect or extract estimated channel bits, which are then decoded into estimated user-data bits. Ideally, the estimated user-data bits would be an identical copy of the original user-data bits. In practice, they can be corrupted by distortion, timing variations, noise and flaws in the medium and in the write/transmit and read/receive channels.

The process of demodulating the analog read signal into a stream of estimated user-data bits can be implemented digitally. Digital demodulation in advanced mass storage systems requires that the analog read signal be sampled at a rate that is on the order of the channel-bit rate. Maximum-likelihood (ML) demodulation is a process of constructing a best estimate of the channel bits that were written based on digitized samples captured from the analog read signal.

FIG. 1 shows an exemplary read signal 100, which is a positive-going pulse generated by an inductive read head, for example, from a single medium transition such as transition 103 from North-South to South-North magnetization of track 104 on a rotating disk. Typically, the write signal modulates a transition in the state of the medium to write a channel bit of 1 and modulates the absence of a medium transition to write a 0 channel bit. Thus, transition 103 corresponds to a single channel bit of value 1 in a stream of 0's.

It is common to use run-length-limited (RLL) encoding of the original user data bits, which are arbitrary or unconstrained, into an RLL-encoded stream of channel bits. It may be desirable that there be no less than d zeroes between ones; that is, that the medium transitions be spaced by at least d+1 bit times. This constraint can help keep to a manageable level the interference effects among the pulses in the analog read signal. On the other hand, because medium transitions provide timing information that must be extracted from the read signal to ensure synchronization of the demodulator with the pulses in the read signal, it may be desirable that there be no more than k zeroes between ones; that is, that there be a medium transition at least every k'th bit time. An RLL(d,k) code is a code that can encode an arbitrary stream of original user-data bits into a stream of channel bits such that the encoded channel bit stream satisfies these two constraints.

For example, the following table shows a commonly used RLL(2,7) code:

| User Data Bits | RLL(2,7)-Encoded Channel Bits |
| --- | --- |
| 000 | 000100 |
| 0010 | 00100100 |
| 0011 | 00001000 |
| 010 | 100100 |
| 011 | 001000 |
| 10 | 0100 |
| 11 | 1000 |

Note that this RLL(2,7) code requires that the information bit rate available for channel bits be twice the bit rate provided for user-data bits. Other RLL codes enforce the constraint that d=1 (i.e. that no adjacent channel bits both be 1). RLL(1,k) encoding is also called one-constraint encoding, or encoding with a minimum run length of 1.

In FIG. 1, sample set 101 shows the values of four samples in the case of side sampling of read signal 100; i.e. 0.333, 1.0, 1.0, and 0.333. Sample set 101 is equivalent to the set 1, 3, 3, 1; that is, only the ratios among samples are significant. A signal model gives rise to an expected sample sequence for a single or isolated transition in medium state. Typically, only a few samples of the response to an isolated medium transition are non-zero; in this case, four are non-zero. In a side-sampled signal model such as 1, 3, 3, 1, timing circuitry in the demodulator attempts to maintain a lock on the incoming signal such that there are two adjacent samples on opposite sides of the peak of an isolated pulse. Other sample timing arrangements may be useful. In center sampling, the timing circuitry trys to lock the sample times to the read signal pulses such that one sample occurs at the peak of each pulse. Sample set 102 shows the values of four samples in the case of center sampling of a similar read signal 105; i.e. 0.5, 1.0, 0.5, and 0.0 (or 1.0, 2.0, 1.0 and 0.0 depending on the arbitrary normalization used). An expected sample sequence of 1, 2, 1 corresponds to the signal model known in the prior art as Extended Partial-Response Class IV (EPR4).

Such sample sequences are samples of a continuous-time analog read-signal waveform such as may be produced in the receiver of a communications system or in the readback circuitry of a storage device. For a system that is bandwidth limited to $1/(2T)$, where T is the sample spacing in time, the sampling theorem declares that the continuous time waveform must be a superposition of sinc functions (sinc(x) is defined as $\sin(x)/x$ for $x<>0$, and as 1 for $x=0$), with one sinc function centered at each sample point and of amplitude equal to that sample value and with zero crossings at all other sample points. As an example, in saturation magnetic recording, the current in an inductive write head takes on values of $+I$ and $-I$. The basic excitation applied to the recording channel is a step in current from $+I$ to $-I$, or vice versa, in the analog write signal. This step in write current produces a transition in the magnetization state of the medium as it moves past the head. When an inductive read head is passed over this magnetic medium transition, a voltage pulse is induced by the bandwidth limited differentiating interaction of the head with the magnetization of the medium. By suitable filtering or equalization, the sequence of samples on an isolated transition response pulse can be made to be {..., 0, 0, 1, 2, 1, 0, 0, ...}, in which case the recording or transmission channel matches the EPR4 signal model.

Another sample sequence well known in the prior art is the Partial Response Class IV signal model (PR4), which corresponds to an expected sample sequence of 0, 1, 1, 0. There are numerous other known signal models. Further, as one is designing or taking measurements on a write/medium/read channel, it may be desirable to take into account the exact response, noise and distortion characteristics of the channel in selecting the signal model to be implemented in the demodulator. Thus, there is a need for a demodulator that is programmable as to the signal model, or expected sequence of sample values for an isolated medium transition.

In data storage it sometimes happens that a data record is not read correctly on the first attempt. Such an event is usually detected by an error detection scheme, but it may not be possible to correct the error(s). In that event the only hope of recovering the data is to attempt another read of the data record. On second and subsequent reads (i.e. on retrys) it may be desirable to change some parameters of the read circuitry in the hopes that such changes will suppress or attenuate the error mechanism. Thus there is need for read-channel electronics that can be easily changed for retries. Additionally, in the case of data storage on rotating disks, the constant angular velocity of the disk results in a variable velocity of the recording medium with respect to the read and write heads. Even if zones are used, in which the channel bit rate varies among zones as the heads move in and out on the disk, there is still a variation in signal shape within each zone from its innermost track to its outermost track. Thus there is a need for read-channel electronics that can be easily changed to accommodate changes in system characteristics.

In situations such as mass information storage in magnetic media, significant storage-system speed and capacity gains can be realized if the information bits can be closer together in position/time on the medium. However, according to information theory the sample rate must be at least as high as the channel bit rate to utilize all available channel capacity. More precisely, the Nyquist sampling criterion requires that the sample frequency be at least twice the highest frequency contained in the signal, or else information is lost due to aliasing. This information loss could be prevented by introducing redundancy through appropriate coding, but this would reduce the channel capacity for user information. All the partial response signal models described herein may contain frequencies up to one-half of the channel bit rate, implying that the sample rate must be no less than the channel bit rate to avoid aliasing. Sampling at exactly the channel bit rate satisfies the Nyquist criterion when the sample times are appropriately synchronized with the signal. Sampling at the channel bit rate is also convenient for synchronization of the demodulator circuits because the demodulator then produces one estimated channel bit per sample.

Therefore, at least one sample of the analog read signal is typically required per channel bit that is to be demodulated from the signal. Digital decoders are typically complex circuits and may require a slower processing or clock rate than can be supported by analog-to-digital converters and simple buffers. Thus, there is a need for demodulator circuitry that can process in real time read-signal samples that are taken at a higher sampling rate than the processing rate of the demodulator itself.

Further, as medium transitions are more closely positioned, the writing and reading processes become more sensitive to the distortion, timing variations and noise that are inevitably introduced in the processes of writing, storing, and reading. Also, as the transitions become closer, the ability of the medium to fully transition from, say, North-South magnetization to South-North magnetization may be taxed. Also, as the medium transitions become closer, interference effects increase among adjacent or nearby transitions.

FIG. 2 shows how positive-going pulse 200 from first medium transition 201 combines with negative-going pulse 202 from second transition 203 to produce analog read signal 204, which can be viewed as the interference of the two pulses. Adjacent medium transitions always give rise to read pulses of opposite polarities because they always are created by transitions of opposite types, for example North-South changes to South-North in transition 201, so adjacent transition 202 must be South-North changing back to North-South. Read signal 204 might give rise to a sequence of samples such as 0.333, 1.0, 0.667, −0.667, −1.0, −0.333. To the extent that the read process is linear (and it may not be entirely linear), the voltage waveform induced in the read head will be the superposition of a sequence of pulses, where each pulse is the response to an isolated magnetic transition on the medium.

Clearly, engineering a high-performance digital demodulator is a complex challenge given the combined effects of the limited sampling rate in a digital demodulator, possibly incomplete transitions in the medium, interference among read-signal responses to medium transitions, and distortion, timing variations, noise and flaws in the medium and in the write and read channels.

The prior art uses a method known as partial-response signaling to increase medium transition rates. Partial-response signaling is described in the book "Digital Transmission of Information", by Richard E. Blahut, 1990, pp. 139-158 and 249-255. This method allows the analog response of the storage/transmission medium and of the write/transmit and read/receive circuitry to a medium transition to overlap with the response to adjacent transitions associated with subsequent information bits. If properly implemented, this method can achieve higher information bit rates/densities than the alternative of requiring the medium transitions to be spaced such that the read signal responses do not overlap significantly. A sequence demodulator is required for partial-response signaling.

The prior art uses the Viterbi algorithm to implement sequence detectors, including demodulators and decoders. The Viterbi algorithm is described in the book "Fast Algorithms for Digital Signal Processing", by Richard E. Blahut, 1985, pp. 387-399. A Viterbi demodulator does not attempt to decide whether or not a medium transition has occurred immediately upon receipt of the sample(s) that correspond to that transition. Rather, as samples are taken from the analog read signal, the Viterbi demodulator keeps a running tally of the error between the actual sample sequence and the sample sequence that would be expected if the medium had been written with a particular sequence of transitions. Such an error tally is simultaneously kept for several possible transition sequences. As more samples are taken, less likely choices for transition sequences are pruned from consideration. If the set of possible sequences of medium transitions is appropriately constrained, then the location of each medium transition becomes known with a high degree of likelihood within a reasonable time after taking the samples corresponding to that transition. This effect is shown in FIG. 5, which illustrates the deferred decision making of a particular Viterbi demodulator in the case of a particular actual sample sequence by showing how the contents of the path memories evolve as additional read-signal samples are taken. A path memory of a sequence demodulator stores information concerning a particular sequence of transitions that is currently being considered as a candidate for the correct transition sequence.

Two of the most significant decisions in designing a modulator and corresponding demodulator are the choice of encoding constraints and the choice of signal models. The encoding constraints chosen may affect the complexity of the demodulator. The filtering and sampling strategy used in the read/receive/demodulate processes can be designed to generate a pulse response to an isolated medium transition that corresponds with the signal model chosen. A sample sequence model is a particular finite-state machine, where the states and transitions of the finite-state machine are determined by the encoding constraints and the signal model chosen. A sequence of expected read-signal samples can be viewed as being generated by a sample sequence model. Viterbi demodulators keep track of one error tally per state in the sample sequence model.

FIG. 3 shows the sample sequence model for a stream of RLL(1,infinity) encoded channel bits as viewed by a demodulator that uses the EPR4 signal model. Each sequence-model transition is represented in FIG. 3 by an arrow labeled both with the expected values for the associated read-signal sample and with the current RLL-encoded channel bit that generated the current medium transition, or lack thereof, in the write/transmit/modulate process. For example, sequence-model transition 301 is labeled with expected sample value 302 (+0.5) and with estimated channel bit value 303 (1). Transition 301 occurs upon taking the sample that shows the leading edge of the positive-going read-signal pulse associated with an isolated medium transition, as might be produced for example in the case of a magnetic medium transition from North-South magnetization to South-North magnetization. Each sequence-model state is represented in FIG. 3 by a circle which, as an aid to understanding, is labeled with a sequence of 3 digits (0 for North and 1 for South) corresponding with the current medium state and the medium states associated with the previous two samples (from right to left). Accordingly, sequence-model transition 301 is the transition from state 000 (or North, North, North) to state 001 (or North, North, South). Note that these state labels do not directly correspond to the sequence of channel bits. Often the sequence-model states are referred to by the decimal equivalents of the state labels used in FIG. 3 as interpreted as three bit binary numbers. All possible sequences of EPR4 signals that can be read from medium written with an RLL constraint of d=1 may be generated by traversing the state diagram of this sample sequence model.

In general, the number of states in a sample sequence model without RLL constraints is $2^N$, where N is the number of samples between the first and last nonzero samples (inclusive) of the system response to its basic excitation. The imposition of coding constraints, such as RLL constraints or other codes mapping from user-data bits to channel bits, may change the number of states and transitions between states. For example, in the case of FIG. 3, because of the RLL constraint of d=1 chosen, the 010 and 101 states are impossible or prohibited states. To take another case, an RLL constraint of k=7 that is incorporated into the sample sequence model may increase the number of sequence-model states. If each sequence-model transition is assumed to occur with some specified probability, then a sample sequence model is equivalent to a Markov model for a source of expected samples.

The labels on the sequence-model transitions shown in FIG. 3 associate the presence (estimated channel bit value of 1) or absence (estimated channel bit value of 0) of a medium transition with the sample where the corresponding read-signal response first appears. There are other ways to associate the estimated channel bits to be output with the sequence-model transitions, e.g. the 1 values could appear on sequence-model transitions that correspond to the peak of the read-signal response.

To understand this sample sequence model, consider a simple decoder for an ideal read signal without noise, distortion or timing variations that is implemented according to the state machine of FIG. 3. This decoder makes one state transition per each sample of the read signal. Assume that this decoder is currently in state 000 (corresponding to a medium sequence of North-South, North-South, North-South, or NNN) and the demodulator receives a sample value of +0.5. This sample indicates the leading edge of a medium transition from North-South magnetization to South-North magnetization. This results in a next state of 001 (or NNS) and a demodulator output or estimated channel bit of 1, which indicates the presence of this medium transition. Because of the one-constraint encoding, the only sample that can be expected to occur next is +1.0, which is the sample that is aligned with the center of the read-signal pulse due to this medium transition. This sample results in a next state of 011 (or NSS) and a demodulator output of 0, which indicates that another medium-transition response does not start with this sample. Because we have now satisfied the run-length constraint, the next sample may or may not be affected by the leading edge of a pulse due to a second medium transition. Thus state 011 has two possible transitions leading from it. If a second medium-transition pulse is starting with the next sample, then the +0.5 trailing sample that must be present due to the first transition would be offset by the −0.5 leading sample of the second medium transition, and the expected sample would be 0.0. Therefore, receiving a sample value of 0.0 results in a next state of 110 (SSN), and an estimated channel bit of 1 to indicate the second medium transition. Alternatively, receiving a sample value of +0.5 indicates that there is not yet another medium transition and results in a next state of 111 (SSS) and a demodulator output of 0. If the state machine is in state 111, then receiving a sample of 0.0 results in a next state of 111 and an output of 0, i.e. no new medium transition. The remaining transitions and states are symmetrical with those in the above description. Given an ideal set of samples, the output of a demodulator that directly implements this state machine would exactly reproduce the channel bits written to the medium.

In operation, a Viterbi demodulator can be thought of as walking the trellis formed by taking each state of a sample sequence model over each sample time. FIG. 4 shows the fundamental frame of the trellis of the EPR4 state machine shown in FIG. 3 between time T and time T+1. Each possible transition of the EPR4 state machine is represented as a branch in the trellis frame. Let S(T) be the read-signal sample taken at time T. Let the branch error metric of, for example, the branch from state 001 to 011, be the quantity $(S(T)-1.0)$ squared, because $+1.0$ is the expected sample value for that branch. Because there is only one sequence-model transition leading into state 011, the path error for state 001 at time T, plus this branch error metric and the associated estimated channel bit is always 0. To take a second example, state 001 could be reached at time $T+1$ either from state 000 with a channel bit of 1 and an expected sample of $+0.5$ or it could be reached from state 100 with a channel bit of 1 and an expected sample of 0.0. So for state 001, both branch error metrics are computed, i.e. the quantity $(S(T)-0.5)\doteq 2$ and $S(T)\doteq 2$. The first branch error metric is added to the path error metric for state 000 at time T, and the second branch error metric is added to the path error metric for state 100 at time T. The Viterbi algorithm then compares these two metrics and the path with the smallest distance from the actual sample sequence is selected as indicating the most likely path along which state 001 might be entered at time $T+1$.

For each sample time, the expected sample for each possible state-machine transition, or trellis branch, is compared with the read-signal sample to generate an error metric for that branch. This branch error metric is accumulated over multiple sample times, thus forming a path error metric. A Euclidean distance metric may be used; i.e. a branch error is the square of the difference between the actual read-signal value and the expected value for that state transition at that sample time. A Euclidean path error would be the square root of the sum of the branch errors along that path, but since only comparisons among path error metrics are significant, there is no need to compute a square root and the sum of the branch errors may be used as the path error metric. Other error metrics may be used, for example the absolute value of the difference between the actual sample and the expected sample. For each state at each sample time, the history of possible paths that may have led to that state is reduced by assuming that the state was entered by that path leading into it that has the lowest path metric. This simplification is justified by the fact that no future samples will shed any further light on which path may have led up to that state at that time. As an example of this calculation, state 000 in FIG. 3 could be entered from either itself or from state 100. In the former case, the expected sample would be 0.0 and in the latter it would be $-0.5$. At each sample time, the current sample is compared with each of these expected sample values. Let S be the current sample and P(X) the current path error metric associated with state X. If $(S+0.5)\doteq 2+P(100)$ is less than $(S-0.0)\doteq 2+P(000)$, then the Viterbi algorithm considers that state 000 would be entered from state 100 at this time and not from the loop from itself. A similar computation is performed for each state at each sample time.

At any sample time, the state that currently has the minimum path error metric could be taken as the correct state and the estimated channel bit could be taken directly from the sequence-model transition corresponding to the chosen branch into that state. But instead, the Viterbi demodulator, like other sequence demodulators, defers this decision until a sequence of subsequent samples has been taken. No attempt is made to determine which state correctly models the channel bit sequence written into the medium at the corresponding write times. Rather, the pruning of unlikely past possibilities occurs only within each state for each sample. Thus, path histories of estimated channel bits must be kept for each state in the sample sequence model. If the modulator and demodulator are designed appropriately for the characteristics of the medium and the read and write channels, then after a reasonable number of samples beyond sample T, the path histories associated with all of the sequence-model states are very likely to make the same estimate of the value of the channel bit corresponding to sample T.

FIG. 5 illustrates the deferred decisions that a Viterbi demodulator makes. This figure was generated by a software implementation of a particular Viterbi demodulator operating on a particular actual sample sequence. Signal 501 represents a digitally sampled ideal read signal without noise, distortion or timing variations. Trellis path 502 is the correct path, i.e. it corresponds to the written channel bits and to ideal read signal 501. Signal 503 is a noise signal that is added to signal 501 to produce actual sample sequence 504. Trellis 506 shows the paths contained in the path memory, after the 10th sample has been taken, for each of the 8 states of the particular sample sequence model used in this figure. Note that after the 10th sample, each path estimates the same sequence-model state corresponding to the 1st through the 5th samples, but that after the 5th sample, the contents of the path memories diverge in order to find the most likely path into the state that they represent at the 10th sample time. Trellis drawings 507–510 show the paths contained in all path memories as of the 11th through the 14th sample time respectively. In each of trellis drawings 506–510, the path histories associated with all of the sequence-model states make the same estimate of all channel bits up to a reasonably recent time, i.e. between 3 to 5 samples prior to the current sample.

In a mathematical sense, the maximum-likelihood decision rule says to choose as the estimate of the written channel bit sequence that sequence, out of all possible channel bit sequences, for which the conditional probability of receiving the actual sample sequence is highest. A Viterbi demodulator sampling the analog read signal at the channel bit rate satisfies this maximum-likelihood criterion if the analog read signal contains white Gaussian noise added to the expected read-signal pulse samples and the analog read signal is passed through a filter with a frequency response matched to the channel.

For each state in the sample sequence model, the path histories of estimated channel bits are kept in a path memory. The path memory in a sequence detector stores the information necessary to define each surviving path in the trellis. In a prior-art Viterbi detector, there is one surviving path for each state of the source model. The information in the path memory may be encoded and managed in a variety of ways. One way is to simply store the sequence of decisions from each ACS module regarding which of its input paths was chosen at each iteration. In this case the path memory amounts to a set of shift registers, and some means must be provided to trace the paths back through the trellis to determine the estimated channel bit sequence that is the primary output of the demodulator. The length of the path memory is the number of frames back through the trellis for which each surviving path can be reconstructed, counting the current frame. In well-designed detectors, there is a high probability that the surviving paths will all emanate from the same sequence-model state at some point in the trellis within the length of the path memory, and thus share a common path before that point. When this is so, any one of the surviving paths may be traced back to determine the demodulator's estimated channel bit output associated with the oldest frame in the path memory.

In practice, a path memory of 6 to 30 bits may be sufficient. That is, it may be large enough to ensure that there is a high probability that the channel bits are identical in each state's path memory for the bits at the least-recent end of each path memory. Path memory requirements depend on the signal model and on the coding constraints applied. For example, a lower value for k in the RLL(d,k) constraints on the channel bits can in some cases lower the length of the path memory required because the occurrence of medium transitions tends to force or expedite the Viterbi algorithm to make significant decisions.

Path memories can be burdensome to implement. Thus there is a need for techniques to reduce the number of path memories required to implement a Viterbi-like algorithm.

In typical prior-art implementations of the Viterbi algorithm, the signed add, square, add, compare and select computation described above is performed for each sequence-model state. The results of the signed add and square computation may be the branch error metric for more than one branch. In this case, the output of some of the modules that implement the computation of the branch error metrics may be used as inputs to more than one add, compare, select (ACS) module. For example, FIG. 6 is a block diagram of an implementation of these steps for the EPR4, d=1 sample sequence model, which is shown in FIG. 3. Branch error metric generators 600-604 implement the signed add and square computation for each of the possible values of expected samples, i..e. $-1.0, -0.5, 0, +0.5,$ and $+1.0$). ACS modules 605, 606, 608, and 609 implement the add, compare, and select computation for states 000, 001, 111, and 110 respectively. Each also stores the current path error metric for the best path, at any given time, into the state it represents. They also communicate, via selection indicator lines 611-614 respectively, to path memories 615 which of the two possible input transitions they have selected as the most likely path into the state they represent. A more detailed block diagram of the implementation of two-input ACS modules 605, 606, 608, and 609 is shown in FIG. 7. Modules 607 and 610 are ACS modules for the special case of states 011 and 100 which have only one sequence-model transition leading into them. Modules 607 and 610 implement the add and store-path-error-metric functions only. In this prior-art Viterbi demodulator implementation, one ACS module is required for each state in the sample sequence model. ACS modules can be burdensome to implement.

As more samples are taken per each medium transition response and as larger amounts of interference are allowed among pulses in the read signal, more states are required in the sample sequence model. Thus there is a need for a technique that reduces the number of ACS modules required to implement a Viterbi-like algorithm.

Consider the following actual sample sequence: 0.0, 0.25, 0.75, 0.75, 0.25, 0.0 in the d=1 EPR4 partial-response model described above. The trellis diagram shown in FIG. 8 shows two paths that could equally well, or equally poorly, have generated such a sequence of samples (there are other such paths: the two paths shown assume that state 000 was the initial state). The channel bit sequences associated with these two paths are 010000 and 001000. They differ by one bit time in terms of where the medium transition occurs. The expected sample sequence associated with the first of these two paths is 0.0, 0.5, 1.0, 0.5, 0.0, 0.0, while the expected sample sequence for the second path is 0.0, 0.0, 0.5, 1.0, 0.5, 0.0. The squared Euclidean metric for each path may be computed for a given actual sample sequence by summing the squares of the differences between the actual sample sequence and each expected sample sequence. The result is that each path arrives in state 111 at time T+5 with a squared path metric of 0.25. This represents a case where the actual sample sequence lies on a decision boundary, and some arbitrary choice must be made between the two paths. More commonly, the sample values will favor one path over the others, for example an actual sample sequence of 0.0, 0.26, 0.75, 0.75, and 0.24 favors the channel-bit sequence of 010000 with its squared path metric of 0.2402, over the channel-bit sequence of 001000 with its squared path metric of 0.2602.

If one of the paths in FIG. 8 is the correct path, i.e. the path representing the sequence-model transitions that correspond to the sequence of written channel bits, then the other path is an error path. The selection by the demodulator of the error path instead of the correct path would constitute an actual error event, and would result in one or more erroneous estimated channel bits being output from the demodulator. The example of FIG. 8 is a closed potential error event beginning at time T+1 and ending at time T+5 because the erroneous path and the correct path converge to the same state at time T+5. In contrast, it would be an open potential error event if the trellis ended at time T+4, before the paths had merged.

More generally, any path through the trellis may be the correct path and any pair of paths in the trellis constitutes a potential error event as long as they begin in the same state. A potential error event is any two paths in the trellis that begin in the same state and diverge in their second state. The beginning of a potential error event is the point where any two paths diverge. A codeword is the expected sample sequence associated with a particular trellis path.

The distance of a potential error event is the distance between the codewords of the two paths of the potential error event. Using the Euclidean metric, the square of this distance is equal to the path error metric that would be built up in the error path if the actual sample sequence corresponded to the ideal sequence for the correct path. The minimum distance for a given signal model is defined as the minimum distance of any closed potential error event or the minimum distance of any open potential error event of duration greater than the path length, whichever is smaller. Since the error rate of the demodulator decreases with increased minimum distance, one is motivated to choose, if possible, a path length sufficient to contain all open error events whose distance is less than the minimum distance of closed potential error events. These considerations are analogous to Hamming distance properties of error correction codes.

At relatively low bit error rates, the performance of a Viterbi demodulator is almost entirely determined by the minimum distance and by the signal-to-noise ratio. Actual error events of distance larger than the minimum distance are quite improbable compared with the minimum distance events and may safely be ignored in the design of the demodulator without seriously affecting the bit error rate. Thus there is a need for a technique that reduces the implementation complexity of the Viterbi algorithm without sacrificing its ability to handle minimum distance error events.

PARTIAL-RESPONSE POLYNOMIALS

A partial-response information channel is ideally equivalent to a finite impulse response (FIR) digital filter. For example, if the input to a magnetic disk recording channel is taken as a sequence of write current levels taking values of plus and minus I, then the unit pulse response of the digital filter is the response to the write current sequence

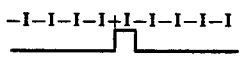

divided by 2I (the amplitude of the current pulse). The DC offset in the above unit pulse is immaterial if the channel response is 0 at DC. This is the case with magnetic disk recording channels using inductive read heads. In other cases, the DC offset can be easily corrected for by subtracting the response to a DC current of $-I$ from the response to the above current pulse. For an EPR4 channel the response to the current pulse above would be as follows:

|  |  |  |  |  |  |  |
|---|---|---|---|---|---|---|
|  | ... 0 0 1 | 2 | 1 | 0 0 0 ... | (response to first transition) |
| plus | ... 0 0 0 | $-1$ | $-2$ | $-1$ 0 0 ... | (response to second transition) |
| to give | ... 0 0 1 | 1 | $-1$ | $-1$ 0 0 ... | (response to pulse) |

Since an ideal partial-response system is equivalent to a discrete-time filter, the analysis techniques used on discrete-time filters can be applied to partial-response systems. One such analysis technique is the Z-transform, in which the inverse of the transform variable z represents a time delay by one sample interval. A similar analysis technique commonly used in magnetic disk storage is the D-transform wherein the transform variable D represents the same delay as the inverse of z. The Z-transform (or D-transform) of the unit pulse response of a digital filter is the transfer function of that filter, and may be used to reveal its characteristics in the frequency domain. For a finite impulse response filter, the D-transform is simply the polynomial in D whose coefficients are the same as the unit pulse response sequence. For the EPR4 unit pulse response sequence of $(1, 1, -1, -1)$, the D-transform is the polynomial $1+D-D^2-D^3$. This polynomial is referred to as the EPR4 partial-response polynomial. This polynomial factors to $(1-D)(1+D)^2$, which reveals that the EPR4 channel has a spectral null at DC and a second order spectral null at the Nyquist frequency of one half the sample rate.

The response of a partial-response channel to a unit pulse can be computed by taking the inverse D-transform of the partial-response polynomial. This amounts to reading the sequence of polynomial coefficients and taking them as the sequence of sample values. It is also possible to determine the response to an isolated transition, otherwise known as the step response of the system, from the partial-response polynomial. This is done by dividing the polynomial by $(1-D)$ and taking the inverse D-transform. Dividing out the $(1-D)$ factor from the EPR4 polynomial leaves the polynomial $(1+2D+D^2)$, which corresponds to the EPR4 isolated pulse of 1, 2, 1.

CONVOLUTIONAL CODES

In addition to their use for demodulating partial-response signals, Viterbi detectors can also be used to decode convolutional codes. Viterbi decoding of convolutional codes is described in the book "Error-Correction Coding for Digital Communications", by George C. Clark Jr., and J. Bibb Cain, 1981, pp. 228-235. The encoding process for a convolutional code may be described as a convolution operation between the data symbol stream and an encoding sequence, called a generator. This encoding process may also be viewed as a filtering operation where the generator is the finite impulse response of a discrete time filter. The convolution or filtering is frequently done with finite field arithmetic (often binary). Redundancy may be introduced into convolutional codes in order to allow error detection and/or correction capabilities by using multiple generators. The encoding filters for the generators operate in parallel and their outputs may be interleaved into a single encoded data stream. By combining multiple generators with decimation or subsampling of the output sequences from each encoding filter one can introduce redundancy in any desired amount. For example, one could use three generators, tripling the number of information symbols, but discard every second symbol from each generator so that the encoder produces 3 encoded symbols for every 2 data symbols and the code rate is ⅔. Such a rate ⅔ encoder is illustrated in FIG. 9.

A partial-response data channel is based on the fact that an isolated step or pulse at the input to the channel produces a particular response of finite duration in the sampled output sequence, and that the response to a sequence of input pulses is the linear superposition of the responses to each individual input pulse. This is equivalent to a rate 1 convolutional code in which the generator is the impulse response of the data channel.

Thus there is a need for a technique for reducing the implementation complexity of Viterbi detectors for decoding of convolutional codes as well as those for demodulation of partial-response signals.

BRIEF SUMMARY OF THE INVENTION

A Viterbi detector, such as may be used to demodulate partial-response signals or to decode convolutional codes, is modified to reduce its implementation complexity. In the case of demodulation, a partial-response signal may be viewed as a sequence of expected samples generated from a finite-state-machine model. In a typical Viterbi demodulator implemented using the add, compare, select method, each state in the expected sample sequence model is associated with a hardware module to perform the functions of adding new branch error metrics to path error metrics, comparing path error metrics, and selecting the path having the lowest path error metric. In the prior art, the required number of these add, compare, select (ACS) modules is equal to the number of sequence-model states. In this invention, an ACS module may have two or more sequence-model states dynamically associated with it, such that at some times one sequence-model state is associated with it and at other times another sequence-model state is associated with it. The present invention reduces the number of ACS modules required and also reduces the size/complexity of the demodulator's path memories which must store one path for each ACS module. Groups of sequence-model states may be chosen to share an ACS module without significant loss in performance as compared to the original, unreduced Viterbi demodulator. Further, the present invention supports a wide range of sample models by making the expected sample sequence of an isolated medium transition programmable. Further, the present invention reduces the speed at which the detector circuitry must operate relative to the sample rate by allowing multiple samples to be processed simultaneously. Further, several reduced detectors for specific sample sequence models are presented for particular applications. The present invention is equally applicable to other types of Viterbi detectors, such as the case of decoders for convolutional codes.

It is an object of the invention to provide sequence detectors, such as demodulators for partial-response signals and decoders for convolutional codes, having reduced implementation complexity. Implementation complexity may be taken to mean the amount of processing required, whether that processing is embodied in logic gates, analog circuits, or software.

Another object of the invention is to accomplish the complexity reduction with minimal degradation of performance as compared to a prior-art Viterbi detector, particularly with respect to minimum distance errors and other errors of relatively high likelihood or importance.

A still further object is to provide sequence detectors, demodulators, and decoders that are well suited for implementation in digital integrated circuit form.

Yet another object is to provide sequence detectors, demodulators, and decoders suitable for signals whose source models contain more states than would otherwise be allowable within given limits for detector complexity.

Another object of the invention is to reduce the path memory required to implement a Viterbi-like algorithm.

Another object is to apply these simplifications regardless of the convolutional code, the sample sequence model, the channel bit encoding constraints, or the signal model used.

A still further object is to apply these simplifications to Viterbi-like demodulators for nonlinear channels, as well as to Viterbi demodulators for linear channels.

Another object is to implement a Viterbi-like detector, demodulator, or decoder with a programmable expected sample sequence for an isolated medium transition. A related object is to support multiple, alternative expected sample sequences for retrys or for situations in which the medium characteristics change, e.g. within or among zones of a disk storage device in which a constant angular velocity of the disk results in variable velocity of the medium with respect to the read or write heads. Another related object is to develop programmable sample sequence models that support multiple signal models that would require distinct sample sequence models and distinct hardware architectures when implemented with non-programmable sample sequences.

Another object is to apply these simplifications regardless of the RLL or other user-data-bit to channel-bit encoding used.

Yet another object is to implement a Viterbi-like detector, demodulator, or decoder that can process two or more actual sample values per detector cycle time.

Another object is to implement sequence detectors for several specific sample sequence models and with several specific selected subsets of potential error events by applying the general techniques of this invention.

DETAILED DESCRIPTION OF THE PREFERRED EMBODIMENT

The present invention can be thought of as exploiting the fact that when, as in the prior art, a separate ACS module is associated with each sequence-model state, then much of the time the ACS modules are computing path error metrics for paths that are so far away from the actual sequence of samples that their computations are very likely to be irrelevant. The present invention dynamically associates a particular ACS module (and its associated path memory) with more than one sequence-model state. One key to practicing the present invention is to determine which states can share an ACS module without significant performance degradation in terms of distinguishing the correct trellis path from those potential error events that are reasonably likely to occur, or that are of special interest for whatever reason.

The following is a step-by-step procedure for determining which states in a sample sequence model may share an ACS module in a sequence demodulator without unacceptable performance degradation. Following the formal description of each step is an example of how that step is applied to the EPR4 d=1 sample sequence model of FIG. 3. Several of the steps are clearly well suited to being carried out with the aid of a computer. Appendix A lists computer software in MATLAB which may be used to help carry out steps 3 through 5. MATLAB is a computing tool distributed by The MathWorks, Inc. of Natick, Mass.

Step 1. Generate a finite-state-machine model for the expected sample sequence from the read signal to be demodulated. Number the states in some convenient fashion.

Figure 1:
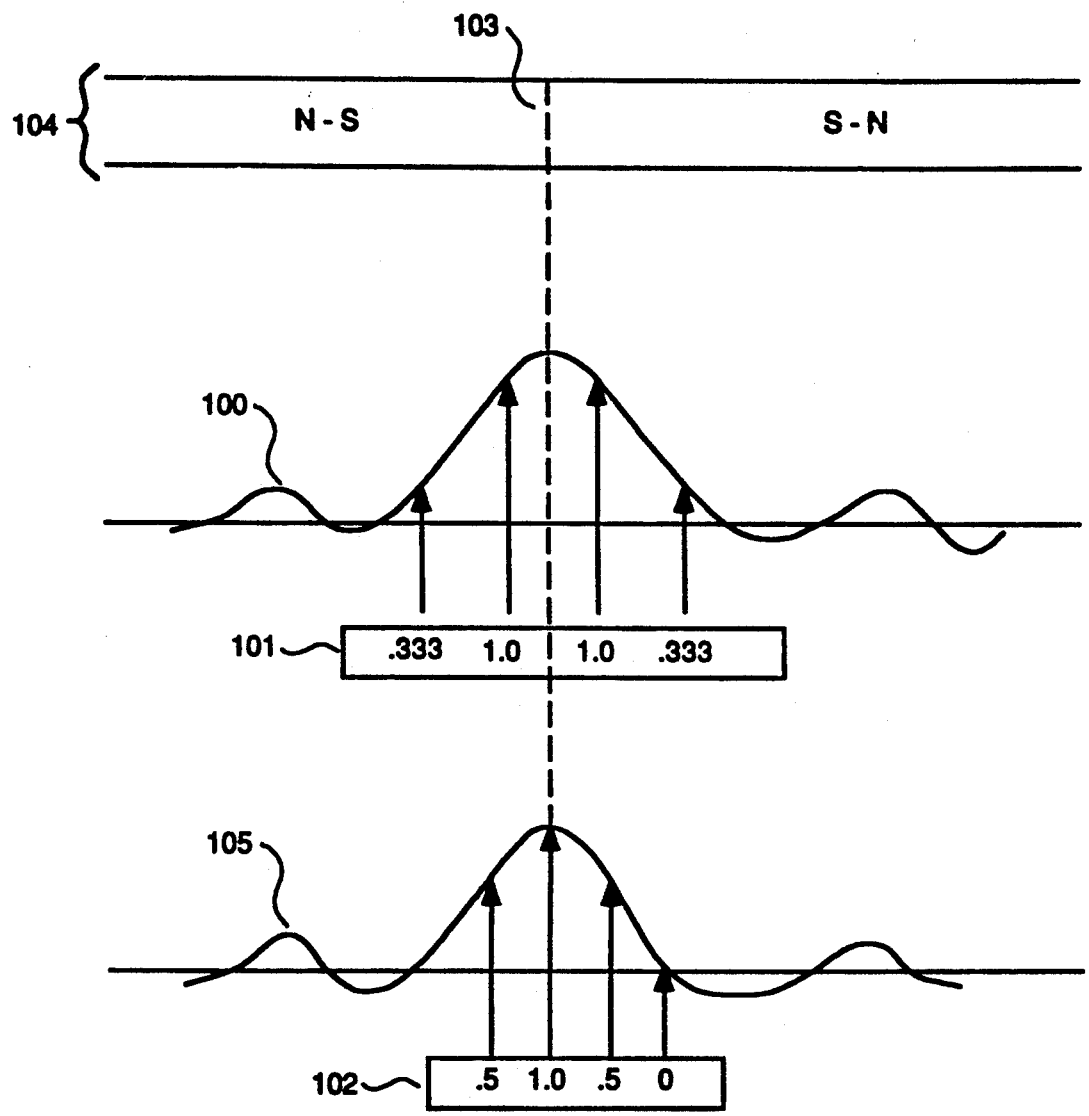
FIG. 1 shows a state transition on a medium such as a track of a disk drive and its associated pulse in an analog read signal. It also shows two digitized sample models of such read-signal pulses.
Figure 2:
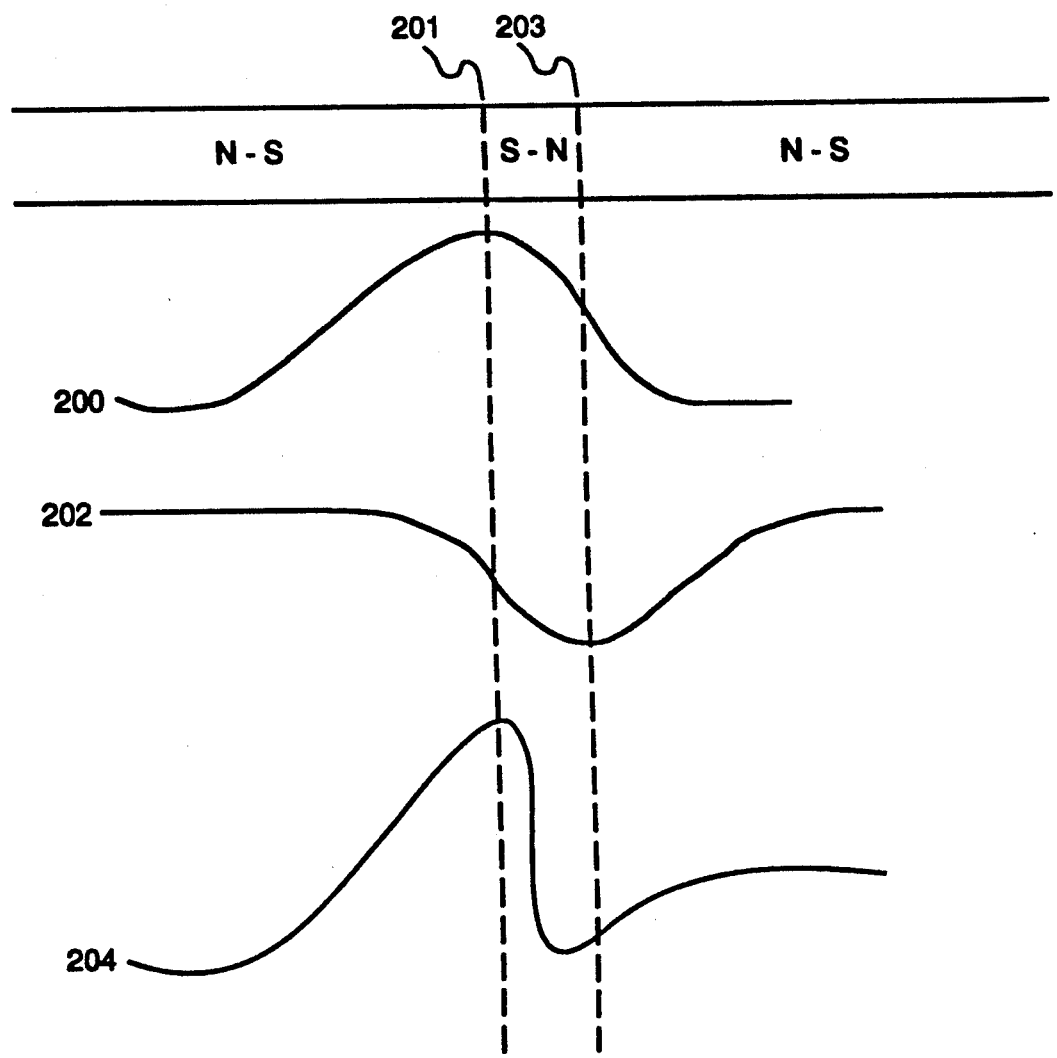
FIG. 2 shows two adjacent medium transitions and their individual and combined read-signal pulses.
Figure 3:
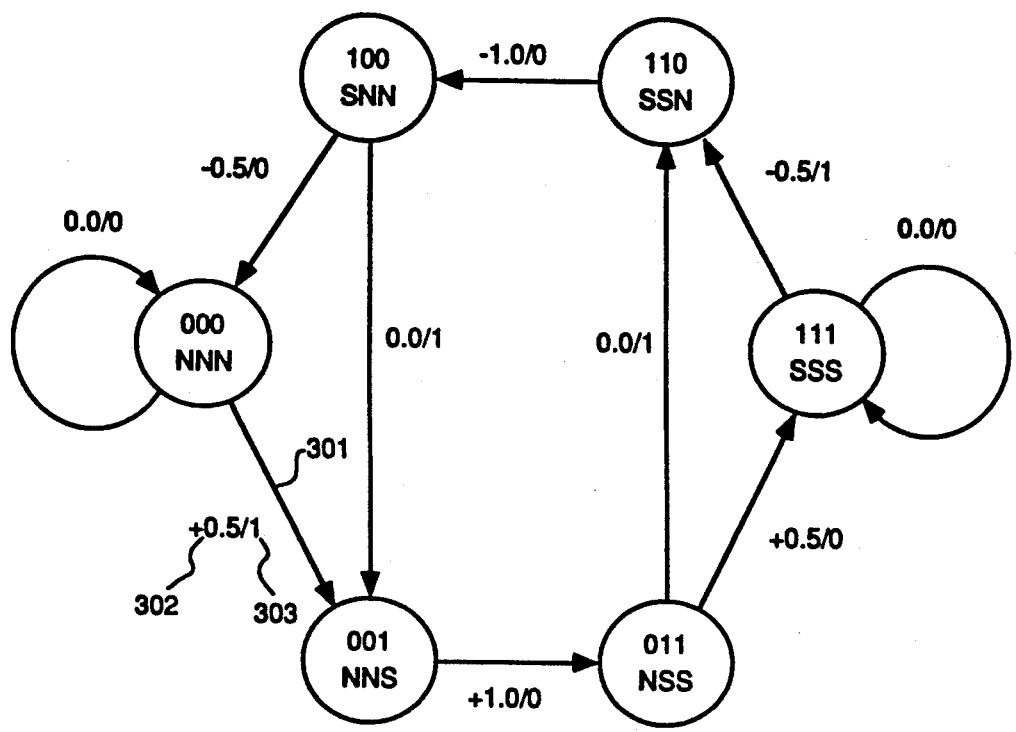
FIG. 3 is the state machine model of the expected sequence of samples for the case of an EPR4 signal model and a $d=1$ run-length constraint.
Figure 4:
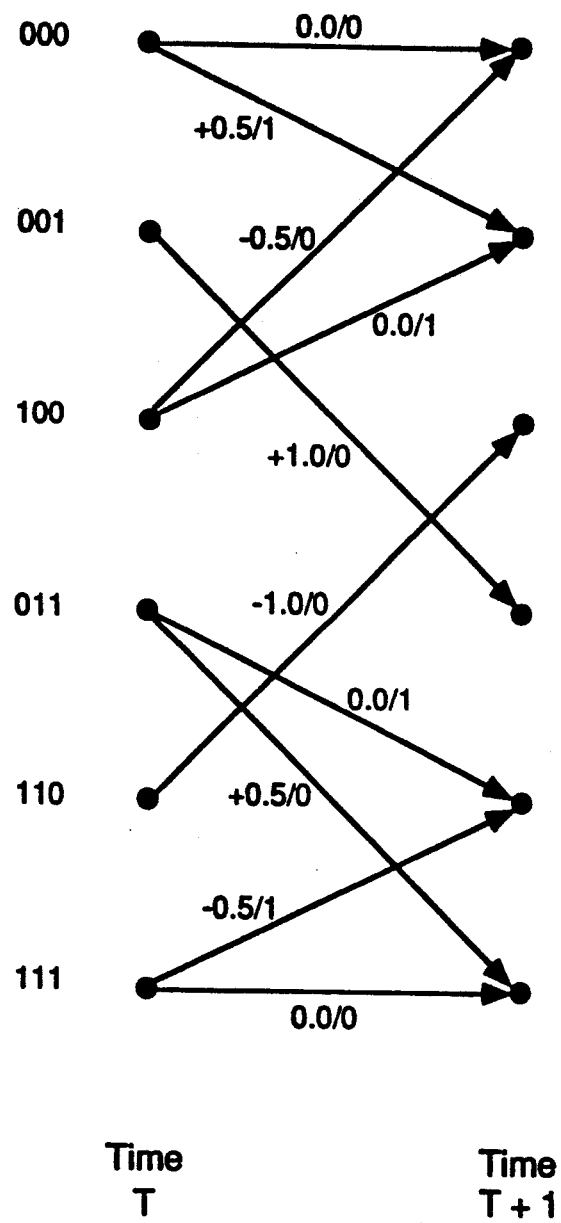
FIG. 4 shows the fundamental frame of the EPR4, $d=1$ trellis.
Figure 5:
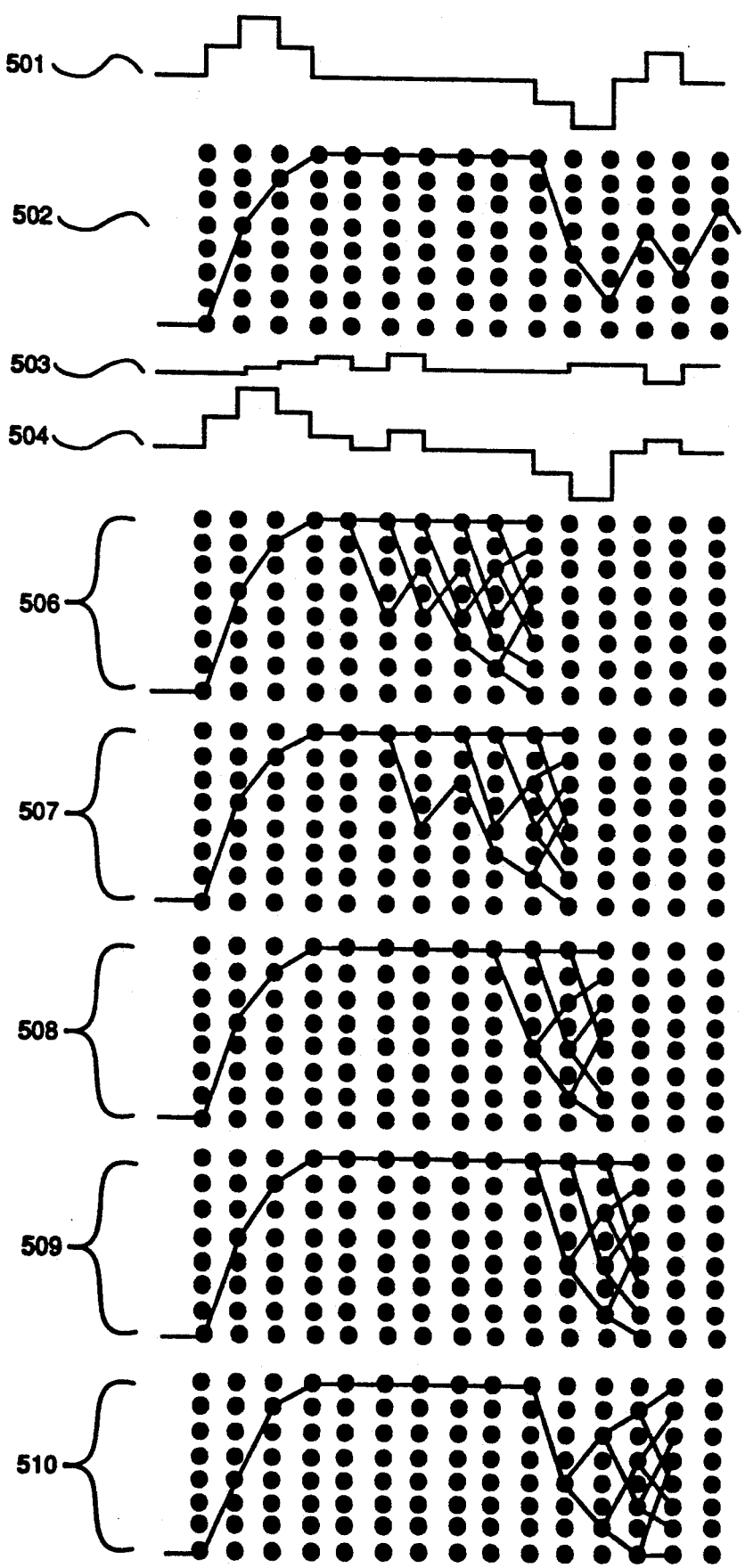
FIG. 5 illustrates the deferred decision making of a particular Viterbi demodulator in the case of a particular actual sample sequence by showing how the contents of the path memories evolve as additional read-signal samples are taken.
Figure 6:
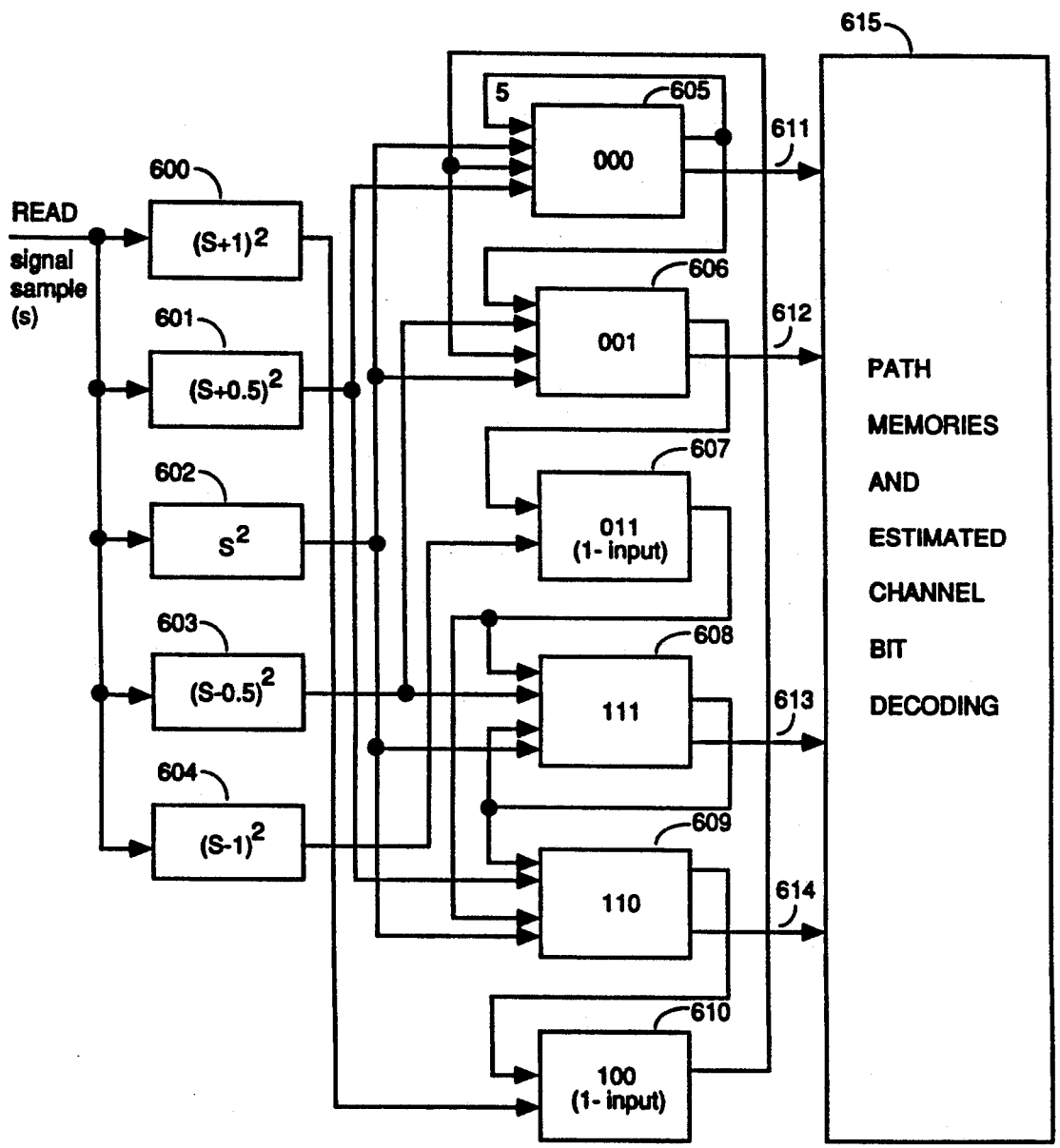
FIG. 6 is a block diagram of a prior-art implementation of a Viterbi demodulator for the EPR4, $d=1$ sample sequence model.
Figure 7:
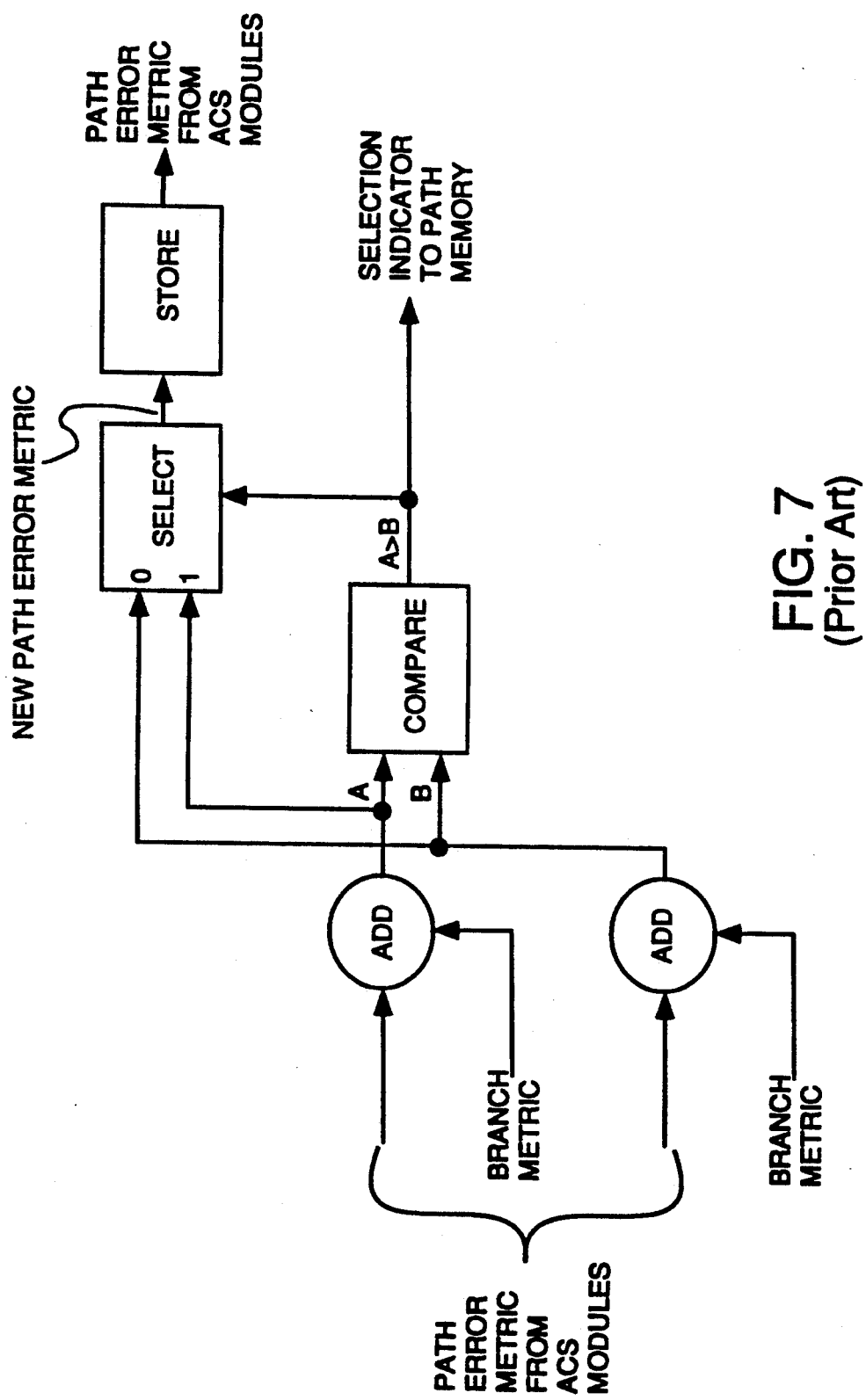
FIG. 7 is a more detailed block diagram of the implementation of an add, compare, select (ACS) module for a sequence-model state having two transitions that may enter the state.
Figure 8:
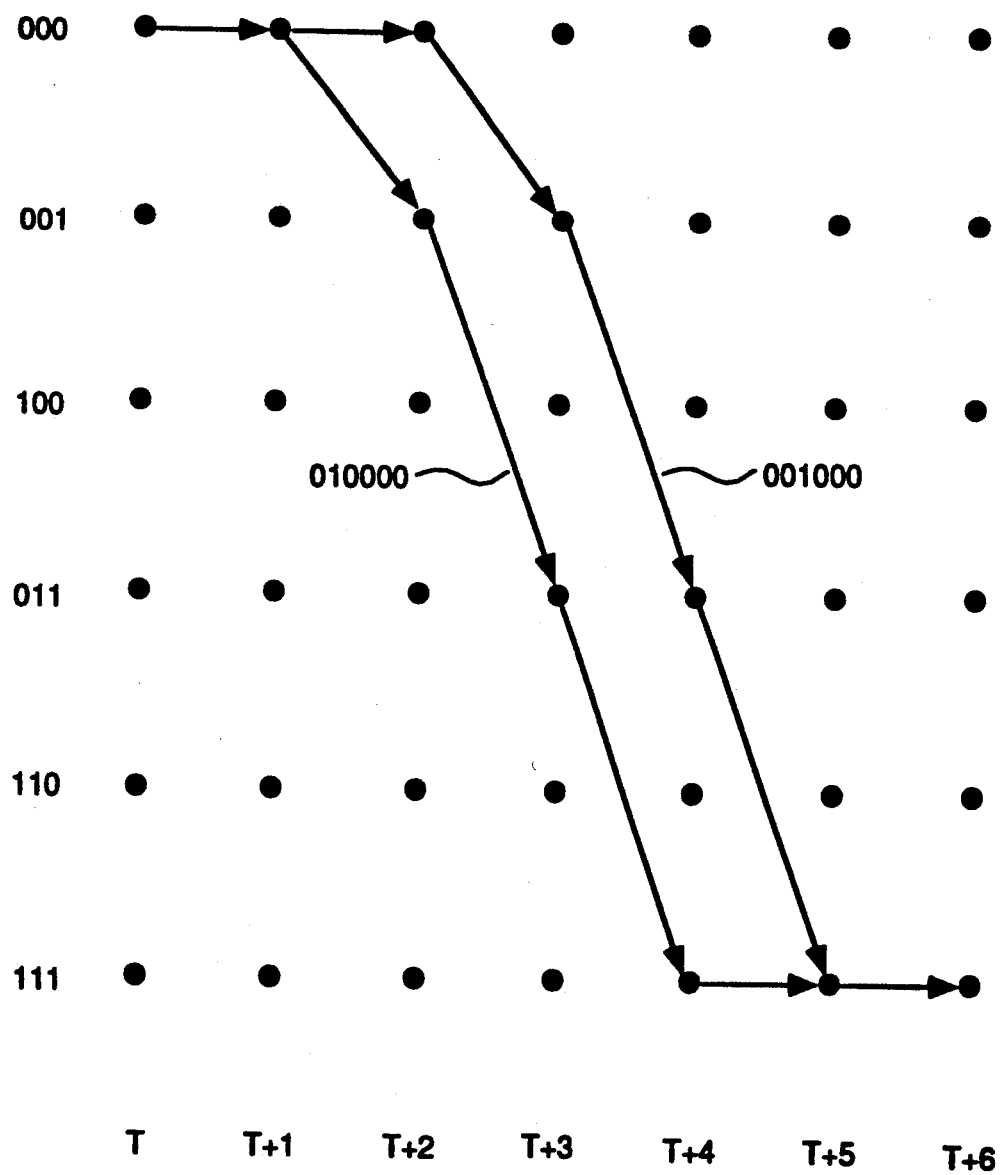
FIG. 8 shows an error event on the EPR4, $d=1$ trellis.
Figure 9:
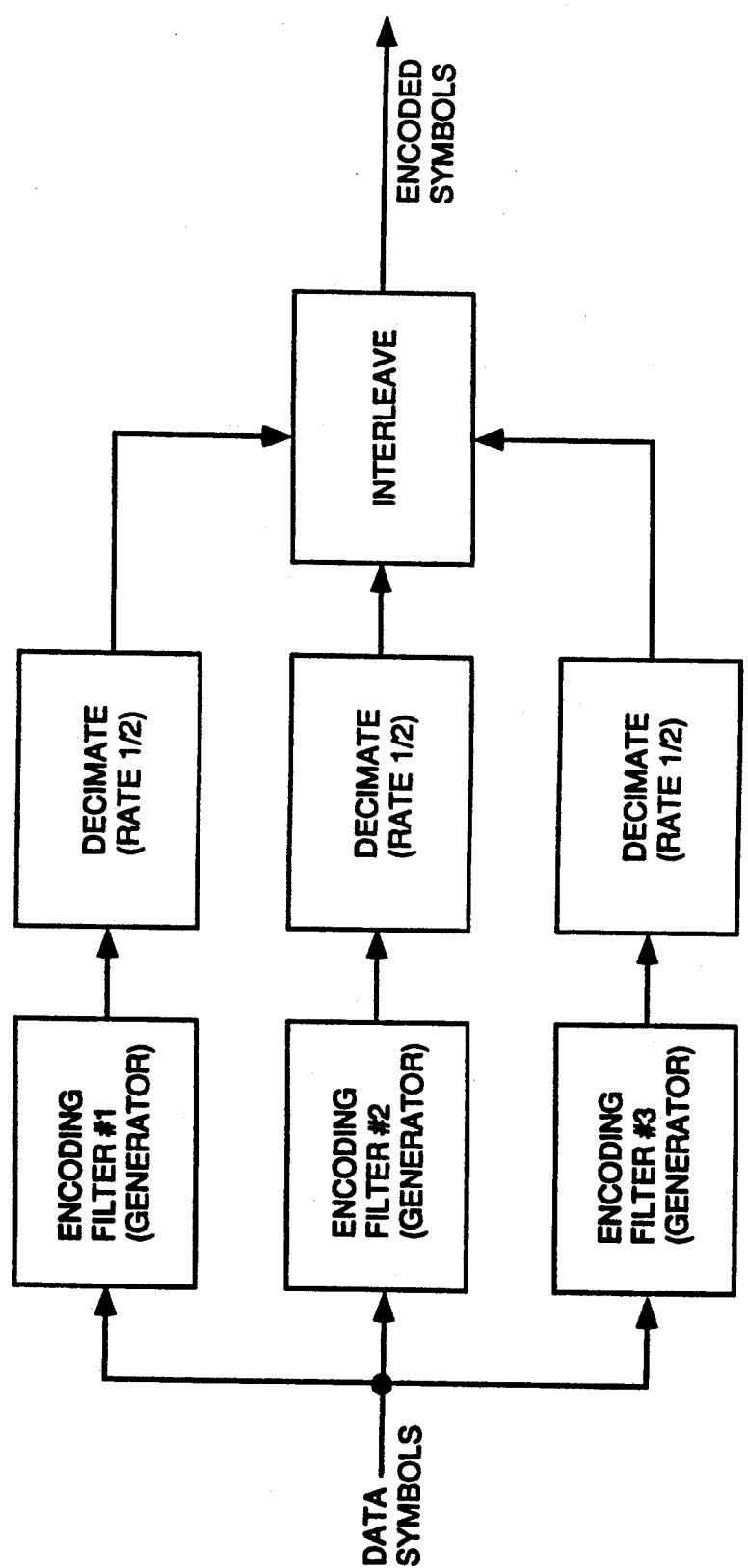
FIG. 9 shows a block diagram of a rate ⅔ encoder for a convolutional code suitable for decoding using the Viterbi algorithm.

FIG. 3 shows the result of step 1 for the EPR4 model with the d=1 constraint. For convenience we shall refer to the states by the decimal equivalent of their binary labels. For example, an isolated pulse of positive polarity is produced by beginning in state 0, moving to state 1, then 3, then 7, and remaining in state 7 via the self-loop. As this model traverses this sequence of states, the expected sample labels on the paths traversed generate the EPR4 sampled pulse, {0.5, 1.0, 0.5, 0, ...}, and the estimated channel bit labels indicate a single 1 that excited the channel to produce this pulse.

Step 2. Choose a length, P, for the path memory in the demodulator. This path length may be only for analysis purposes, and the path length implemented may be different if desired.

In general one should choose a path length no less than the maximum duration of any open or closed potential error event at minimum distance. Other factors may also be involved in the choice of path length, particularly in cases where there exist open potential error events of infinite length at minimum distance. We choose path length P=6 for our example, which is known to be adequate for the EPR4, d=1 sample sequence model.

Step 3. Make a complete list of all codewords, or legal sequences of expected samples, that are of length P or less. Include in the list the sequence of states that generates each codeword. A codeword of length n is any sequence of expected samples that can be generated by n consecutive state transitions of the state machine from step 1. For this purpose, two codewords are considered distinct if their state sequences differ, even if the expected sample sequence is the same. In general, codewords of length less than the path memory length, P, must be considered in addition to codewords of length P.

It is not practical to include the exhaustive list of EPR4 d=1 codewords of length 6 or less in this document. As an example we list all sample sequences of length 4 that begin in state 0 (000). (In performing this step, all sample sequences of length 4 beginning in any state must be considered, only those starting in state 0 being used herein for illustration purposes.) Note that the state sequences for length 4 sample sequences have 5 entries because they contain both the beginning and ending states.

| CODEWORD | STATE SEQUENCE |
|---|---|
| 0 0 0 0 | 0 0 0 0 0 |
| 0 0 0 1 | 0 0 0 0 1 |
| 0 0 1 2 | 0 0 0 1 3 |
| 0 1 2 1 | 0 0 1 3 7 |
| 0 1 2 0 | 0 0 1 3 6 |
| 1 2 1 0 | 0 1 3 7 7 |
| 1 2 1 −1 | 0 1 3 7 6 |
| 1 2 0 −2 | 0 1 3 6 4 |

Step 4. Consider all possible potential error events, both open and closed, from the list of sample sequences generated in Step 3. A potential error event is any pair of sample sequences of equal length which have the same starting state but differ in the second state in their sequences. It is possible for the first sample sequence to be the correct (transmitted or stored) sample sequence while the demodulator erroneously chooses the second sample sequence. An error event is "closed" if the two state sequences ever return to the same state at the same time (even if they do not remain together), otherwise it is "open". Choose a subset of potential error events for which you would like to preserve the error-handing performance of the full Viterbi demodulator.

For our EPR4 example, we choose to include the set of potential error events whose distance is less than or equal to 2, since 2 is the minimum distance of all closed potential error events and there exist no open potential error events longer than our path memory of distance less than or equal to 2. Using the Euclidean norm, the distance of an error event is the square root of the sum of the squares of the differences in each element between the two codewords comprising the error event. From our example list in step 3, the following 3 potential error events of length 4 are selected:

| CODEWORD | STATE SEQUENCE | DISTANCE |
|---|---|---|
| 0 1 2 1 | 0 0 1 3 7 | |
| 1 2 1 0 | 0 1 3 7 7 | 2 (closed) |
| 0 1 2 0 | 0 0 1 3 6 | |
| 1 2 1 0 | 0 1 3 7 7 | 1.732 (open) |
| 0 1 2 0 | 0 0 1 3 6 | |
| 1 2 1 −1 | 0 1 3 7 6 | 2 (closed) |

Step 5. Build a sharing table with one row and one column for each state in the state machine from step 1. Begin with each element of the sharing table TRUE. An element is marked FALSE if the two states represented by its row and its column are ever simultaneously occupied by the two state sequences of any error event in the chosen set. This criterion applies at any position in each error-event state sequence for the subset of potential error events selected in step 4. In the sharing table, either the order of the states can be taken both ways, or alternatively only the upper triangle of the sharing table can be used. All remaining TRUE elements in the sharing table, if any, indicate that the corresponding pair of states may share an ACS module in the demodulator without sacrificing the ability to handle every error event in the chosen subset just as it would be handled in the full Viterbi demodulator.

For the EPR4 d=1 example, we will build a sharing table with 6 rows and 6 columns. Each entry is presumed TRUE until shown to be FALSE. Consider the first error event from the example list in step 4. The state sequence for the first sample sequence is in state 0 at the second clock cycle, while the state sequence for the second sample sequence is in state 1. This means that to distinguish between these two paths and properly process this error event we must not share an ACS module between states 0 and 1. Thus mark the element in the sharing table in the row for state 0 and the column for state 1 as FALSE. Also mark the element in the sharing table in the column for state 0 and the row for state 1 as FALSE. The remainder of the state sequences for the first example error event imply that the pairs (1,3) and (3,7) are also unable to share an ACS module. When this line of reasoning is continued through all error events in the subset selected in step 4, the following sharing table results (where 1 means TRUE and 0 means FALSE):

| | (0) 000 | (1) 001 | (3) 011 | (7) 111 | (6) 110 | (4) 100 |
|---|---|---|---|---|---|---|
| (0) 000 | 1 | 0 | 1 | 1 | 1 | 0 |
| (1) 001 | 0 | 1 | 0 | 1 | 1 | 1 |
| (3) 011 | 1 | 0 | 1 | 0 | 1 | 1 |
| (7) 111 | 1 | 1 | 0 | 1 | 0 | 1 |
| (6) 110 | 1 | 1 | 1 | 0 | 1 | 0 |
| (4) 100 | 0 | 1 | 1 | 1 | 0 | 1 |

The above sharing table shows whether pairs of states can share an ACS module based on both the error events listed as examples in step 3 and on the additional error events that must be considered but were not listed in the example. When in a full execution of step 3 one considers the sample sequences that start from state 7 (111) and the related error events of step 4, one finds that the two pairs of states (0,4) and (4,6) cannot share an ACS module. It happens that sample sequences that start from states other than 0 or 7 do not yield any additional pairs of states that can not share.

Figure 10:
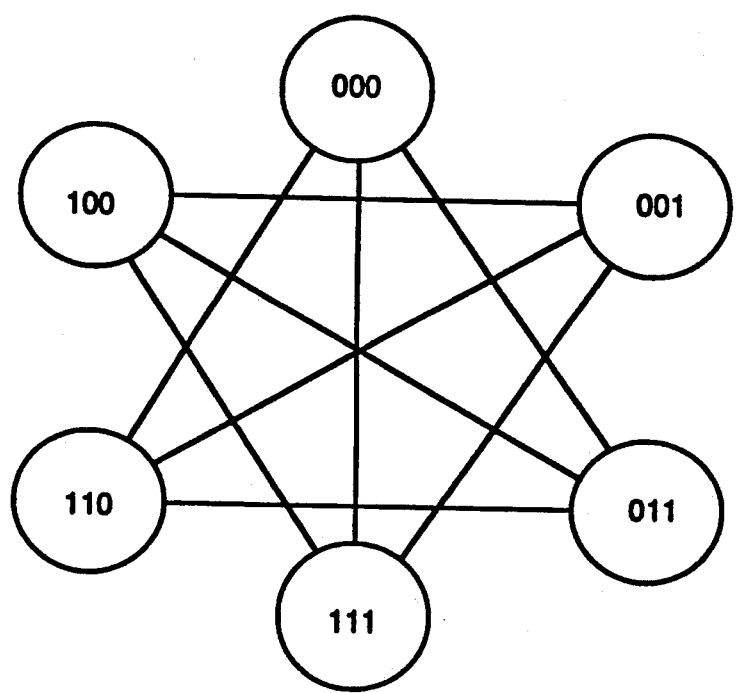
FIG. 10 is a sharing diagram where a line between states indicates that that pair of states from the EPR4, $d=1$ sample sequence model of FIG. 3 can share an ACS module in the demodulator based on the criterion that all error events of distance less than or equal to 2 must be handled properly, i.e. in the same fashion as would a Viterbi demodulator with one ACS module for each of the 6 states of the sample sequence model.

FIG. 10 shows the information from the above EPR4 d=1 sharing table in a graphical way. Each circle represents one of the 6 states. Each pair of states that are allowed to share an ACS module is connected with a line. A group of states may mutually share an ACS module only if every pair within the group is allowed to share.

Step 6. Decide how to group the states that are allowed to share ACS modules, if any. The states may be grouped to obtain the minimum number of ACS modules possible, or non-minimum groupings may be chosen because of other desirable properties.

The EPR4 d=1 sharing table from step 5 indicates that there is only one grouping possible that uses only two ACS modules. In this grouping, one ACS module is shared by states 000, 011, and 110, while the second ACS module is shared by states 001, 111, and 100.

Other groupings are possible using more than 2 ACS modules. One of particular interest is to share in the pairs: 000 with 111, 001 with 110, and 100 with 011. With this sharing arrangement, the path labels have a fixed magnitude and only depend on the state of origin for their signs, potentially resulting in further simplification of the implementation of the branch-error-metric computation.

To prevent substantial performance loss one should include all minimum distance potential error events in the chosen subset. Other potential error events may be included as desired. For example, one could choose to include all the potential error events whose distance was less than a specified threshold which is greater than the minimum distance. Or one could choose to include all potential error events that can be characterized as resulting from a particular non-ideal aspect of the information channel, such as dropouts from defects in magnetic media. Potential error events of length less than the path memory length, P, must be considered in addition to error events of length P. This can be seen by first considering error events of length 2. The 2 terminal states of a length 2 error event cannot share an ACS module unless the associated error event at length 2 has already exceeded the threshold distance. It may be possible that all length P extensions of this length 2 error event exceed the threshold distance, but the fact that all extensions exceed the threshold distance is not sufficient for the 2 states to share an ACS module. This argument can be extended to pairs of states on error events of any length less than P. Thus, if such a potential error event were the only one to forbid sharing between a particular pair of states, and if one considered only potential error events of length P, one would erroneously conclude that the pair of states in question were able to share an ACS module. In reality, such sharing would force a premature decision between two paths whose distance was still below the threshold at the time the decision was made. This would reduce the effective minimum distance and increase the error rate accordingly.

This completes the step by step process for determining which states will share ACS modules in a sequence detector. This process may be applied to any state-machine signal model to design a reduced complexity Viterbi-like detector for that signal. By suitable choice of the selected subset of error events, one can control the performance degradation associated with the complexity reduction. It is frequently possible to obtain substantial complexity reduction with negligible performance degradation. Principles and examples follow which indicate how such detectors may be implemented.

The sharing of ACS modules may be viewed as a dynamic association of the source-model states with the ACS modules. The sharing of ACS modules is implemented by adding one or more memory bits to each shared module to indicate which state the module represents at any given time. The number of memory bits must be sufficient to allow a unique representation for each state sharing the module, thus requiring the number of bits to be greater than or equal to the base-2 logarithm of the number of states sharing the module. At each processing cycle, the branch error metrics for all input paths to a given ACS module are evaluated and added to the corresponding path error metrics stored in other ACS modules. The new path error metrics are compared and the lowest one is selected as the surviving path for that ACS module. The new path error metric for the surviving path is stored in the ACS module for use in the next clock cycle. In addition, the most recent state from which the surviving path comes uniquely defines which state the current ACS module should represent at this time, so its memory bits are set appropriately. The labels on the paths leaving the ACS module, which will be used to generate branch error metrics during the next clock cycle, are determined by the memory bits within the ACS module.

Figure 11:
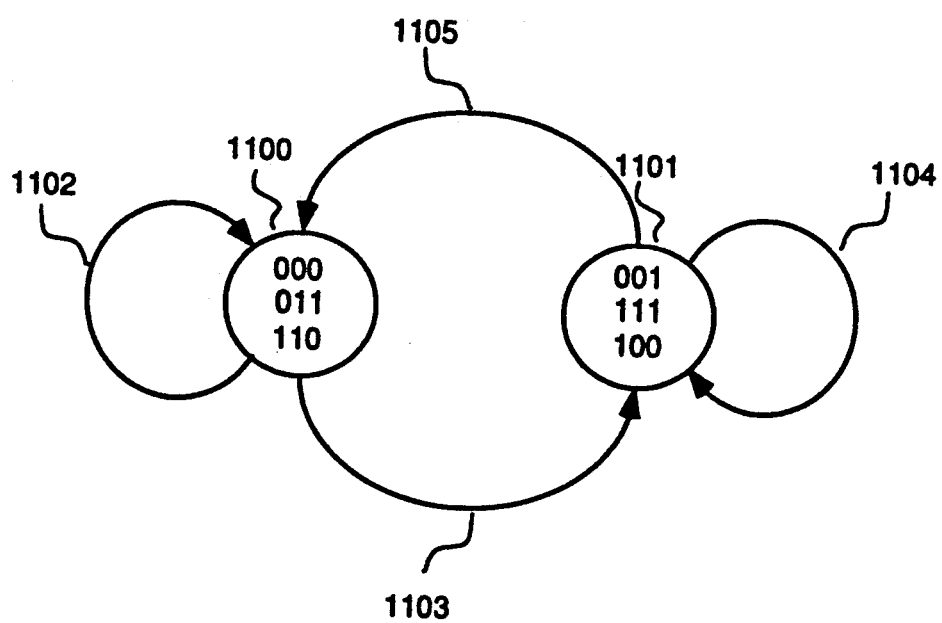
FIG. 11 is a version of the sample sequence model from FIG. 3, showing how a reduced-complexity detector for that signal may be constructed with only two ACS modules that each represent one of three states at any given time.

FIG. 11 is a sample sequence model in which the sequence-model states from FIG. 3 have been grouped into two groups that share ACS modules based on the sharing diagram of FIG. 10. ACS module 1100 is associated with one of states 000, 011, or 110 at any given point in time. ACS module 1101 is associated with one of the remaining three states at any given point in time. Transition 1102 either represents the transition from state 000 to itself (if ACS module 1101 currently is in state 000), or it represents the transition from state 011 to state 100 (if ACS module 1101 currently is in state 011). Transition 1102 can be described by the following table:

| Current State | Next State | Expected Sample / Estimated Channel Bit |
|---|---|---|
| 000 | 000 | 0.0 / 0 |
| 011 | 110 | 0.0 / 1 |

For example, if ACS module 1100 internal state memory bits indicate that it represents state 011 at a particular time, then the self-loop on that module has an expected sample of 0.0, an estimated channel bit of 1. Should that path be selected, then the next state to be represented by that ACS module is 110. Note that if the present state is 110, then the self-loop from ACS module 1100 to itself does not exist and some means must be provided to prevent its selection.

Similarly, transition 1103 can be represented by the following table:

| Current State | Next State | Expected Sample / Estimated Channel Bit |
|---|---|---|
| 000 | 001 | 0.5 / 1 |
| 011 | 111 | 0.5 / 0 |
| 110 | 100 | −1.0 / 0 |

Transition 1104 can be represented by the following table:

| Current State | Next State | Expected Sample / Estimated Channel Bit |
|---|---|---|
| 111 | 111 | 0.0 / 0 |
| 100 | 001 | 0.0 / 1 |

Note that if the present state is 001, then the self loop does not exist and some means must be provided to prevent its selection.

Transition 1105 can be represented by the following table:

| Current State | Next State | Expected Sample / Estimated Channel Bit |
|---|---|---|
| 001 | 011 | −1.0 / 0 |
| 111 | 110 | −0.5 / 1 |
| 100 | 000 | −0.5 / 0 |

Each path in FIG. 11 is now in effect labeled with a table showing the expected sample labels and the estimated channel bit (to be output to the path memory) labels and the next state for each of the possible states that may be represented by the ACS module from which the path originates.

Figure 12:
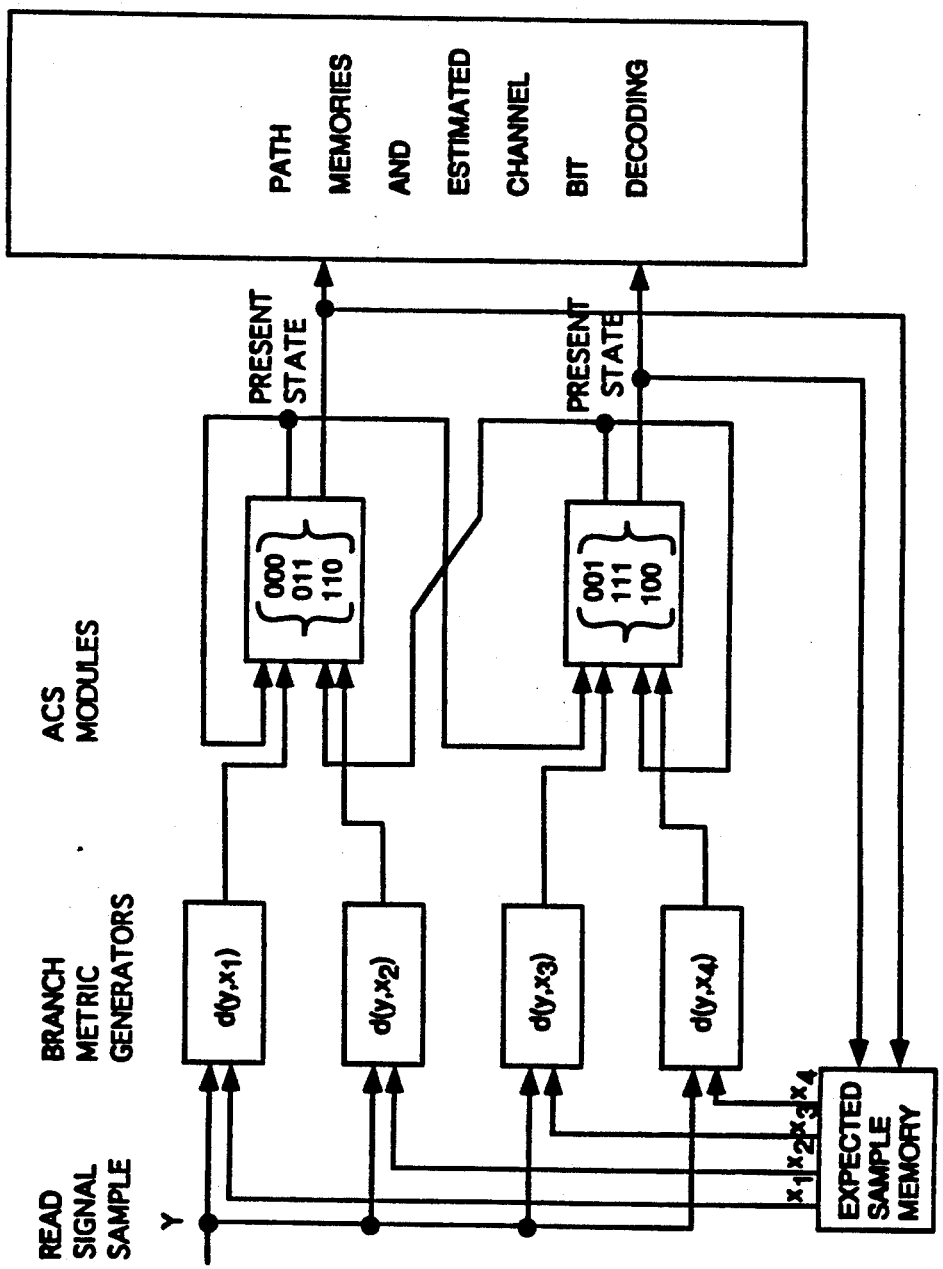
FIG. 12 is a block diagram of a simplified implementation of the demodulator shown in FIG. 6 using only two ACS modules selected according to the sharing diagram of FIG. 10.

The block diagram in FIG. 12 shows an implementation of a reduced-complexity Viterbi demodulator for EPR4 signals with $d=1$ simplified in accordance with the sharing diagram of FIG. 10 and the grouped sample sequence model of FIG. 11. There are only two ACS modules, each having only two sequence-model transitions to select between and each representing one of three states at any particular time. There are only 4 branch error metric generators even though there are 5 different expected-sample values as path labels. This is possible because the total number of paths in the state machine of FIG. 11 is only 4, implying that it is never the case that branch error metrics for all 5 expected sample values will be needed simultaneously. The expected sample memory stores the expected sample labels from the tables for each path in FIG. 11.

Figure 13:
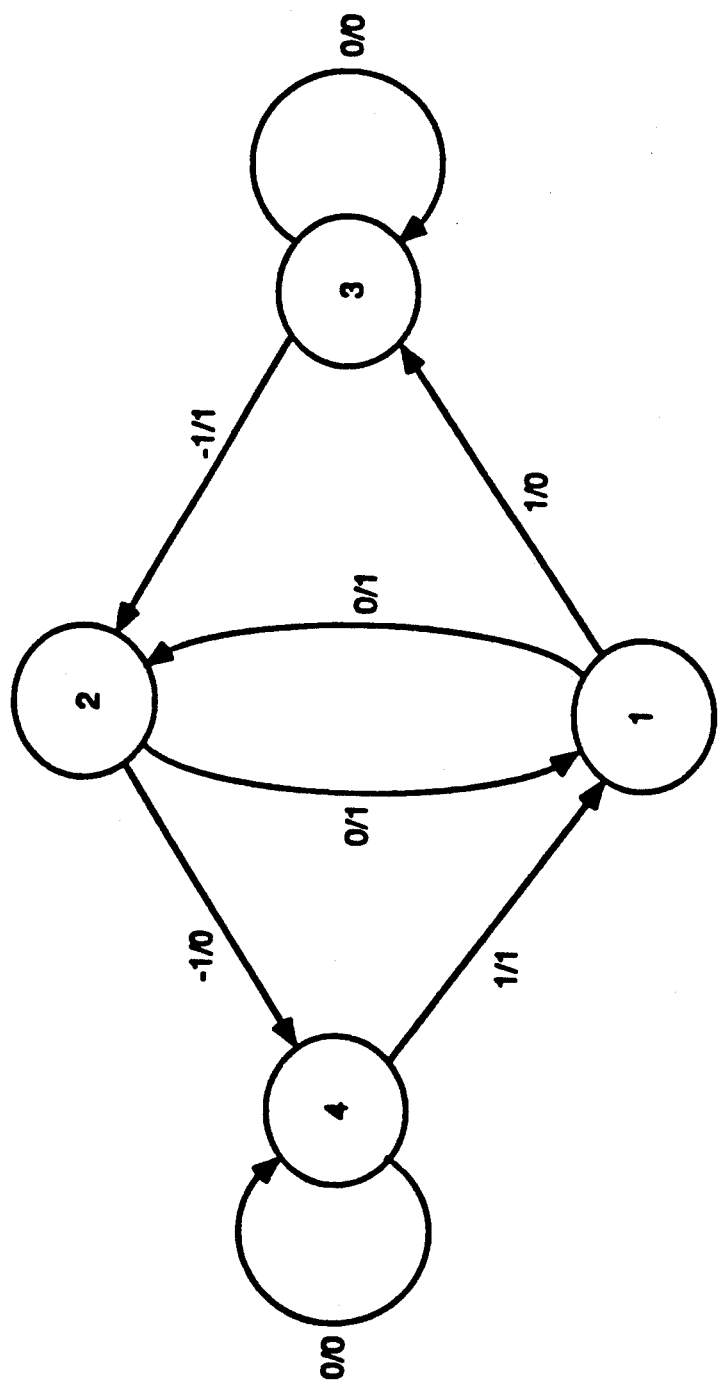
FIG. 13 is a sample sequence model for a partial-response class IV (PR4) signal without RLL constraints. The corresponding partial-response polynomial is $(1-D)(1+D)$, and the expected sample sequence for an isolated transition is 1, 1.

FIG. 13 is a sample sequence model for a partial-response class IV (PR4) signal without RLL constraints. The corresponding partial-response polynomial is $(1-D)(1+D)$, and the expected sample sequence for an isolated medium transition is 1, 1. Using for reference purposes, as was done for FIG. 3, a "0" for one state of the media from which the signal was produced and a "1" for the other state, the numbered states of FIG. 13 may be given the following representation:

| State Number | Media State Sequences |
|---|---|
| 1 | 01 |
| 2 | 10 |
| 3 | 11 |
| 4 | 00 |

Figure 14:
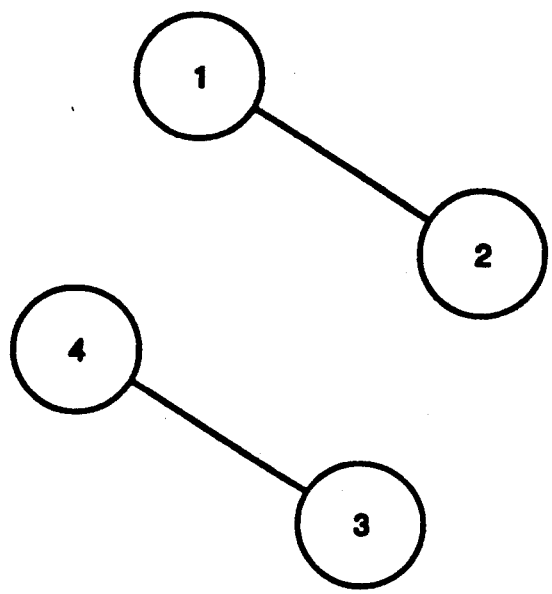
FIG. 14 is a sharing diagram for the sample sequence model of FIG. 13 under the condition that all error events of distance less than or equal to the square root of 2 are resolved properly, with a path length of $P=10$.

FIG. 14 is a sharing diagram for the sample sequence model of FIG. 13 under the condition that all error events of distance less than or equal to the square root of 2 are resolved properly for a path length of $P=10$, i.e. are resolved as they would be by a full Viterbi demodulator with one ACS module per sequence-model state. FIG. 14 shows that there is a unique grouping for a grouped sample sequence model with a minimum number of ACS modules: i.e. states 1 with 2; and states 3 with 4.

Figure 15:
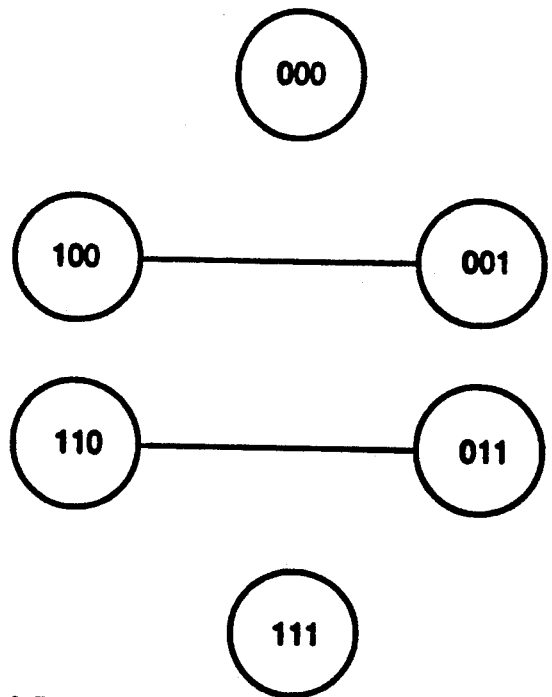
FIG. 15 is a sharing diagram for the sample sequence model of FIG. 3 under the conditions that all error events of distance less than or equal to 2 and all error events that correspond to drop-outs or drop-ins are resolved properly with a path length of P=6.

FIG. 15 is a sharing diagram for the sample sequence model of FIG. 3 (EPR4, $d=1$) under the conditions that all error events of distance less than or equal to 2 and all error events that correspond to drop-out or drop-in error events (more thoroughly described later) are resolved properly with a path length of $P=6$. FIG. 15 shows that there is a unique minimum-ACS grouping for this case: i.e. states 100 with 001; states 110 with 011; state 000; and state 111.

Figure 16:
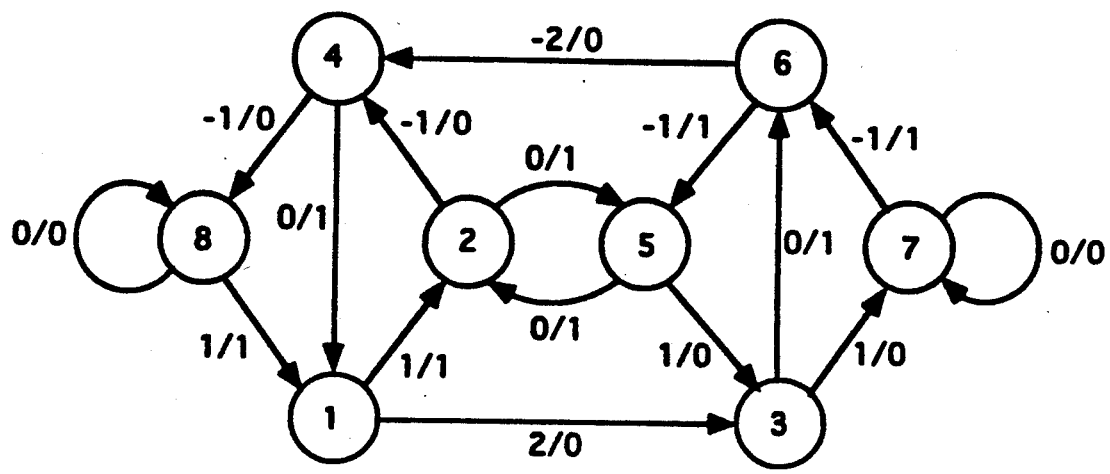
FIG. 16 is the sample sequence model for an extended partial-response class IV (EPR4) signal without RLL constraints. The corresponding partial-response polynomial is $(1-D)(1+D)^2$, and the expected sample sequence for an isolated transition is 1, 2, 1.

FIG. 16 is a sample sequence model for an extended partial-response class IV (EPR4) signal without RLL constraints. The corresponding partial-response polynomial is $(1-D)(1+D)$ 2, and the expected sample sequence for an isolated medium transition is 1, 2, 1. Again using for reference purposes, a "0" for one state of the media from which the signal was produced and a "1" for the other state, the numbered states of FIG. 16 may be given the following representations:

| State Number | Media State Sequences |
|---|---|
| 1 | 001 |
| 2 | 010 |
| 3 | 011 |
| 4 | 100 |
| 5 | 101 |
| 6 | 110 |
| 7 | 111 |
| 8 | 000 |

Figure 17:
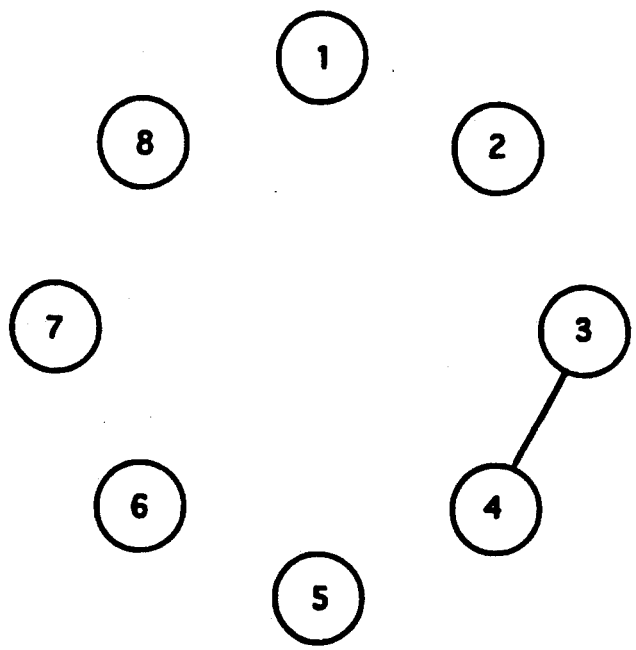
FIG. 17 is a sharing diagram for the sample sequence model of FIG. 16 under the condition that all error events of distance less than or equal to 2 are resolved properly, with a path length of P=10.

FIG. 17 is a sharing diagram for the signal model of FIG. 16 under the condition that all error events of distance less than or equal to 2 are resolved properly with a path length of $P=10$. There is only one ACS module that can be shared among two states in this case: i.e. states 3 and 4.

Figure 18:
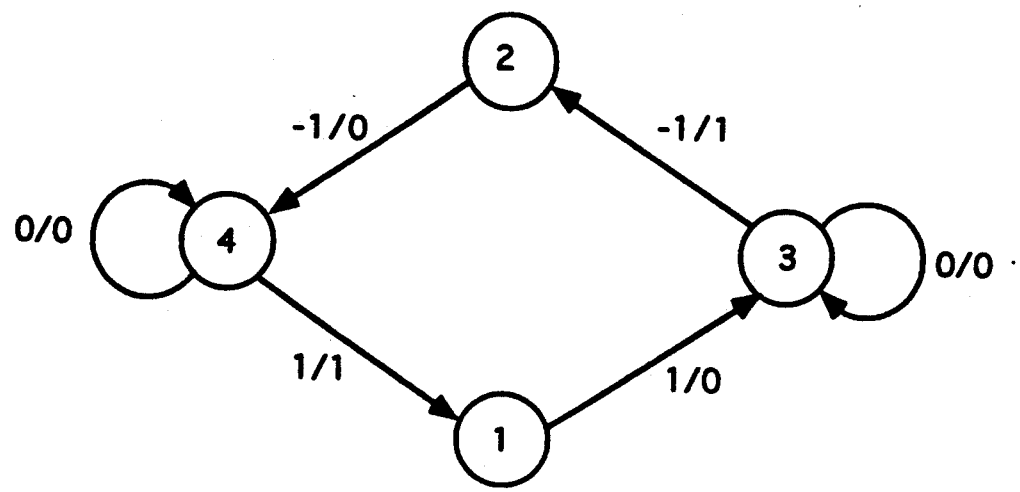
FIG. 18 is a sample sequence model for a partial-response class IV (PR4) signal with an RLL constraint of d=1. The expected sample sequence for an isolated transition is 1,1.

FIG. 18 is a sample sequence model for a partial-response class IV (PR4) signal with an RLL constraint of $d=1$. The expected sample sequence for an isolated medium transition is 1, 1. Again using for reference purposes, a "0" for one state of the media from which the signal was produced and a "1" for the other state, the numbered states of FIG. 18 may be given the following representations:

| State Number | Media State Sequences |
|---|---|
| 1 | 01 |
| 2 | 10 |
| 3 | 11 |
| 4 | 00 |

Figure 19:
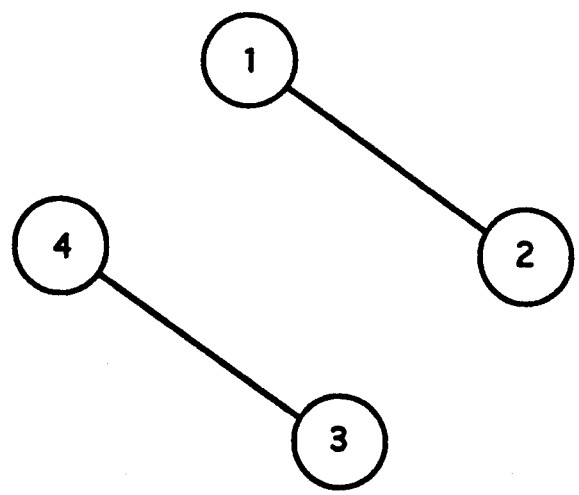
FIG. 19 is a sharing diagram for the sample sequence model of FIG. 18 under the condition that all error events of distance less than or equal to the square root of 2 are resolved properly, with a path length of P=10. This same sharing diagram applies when the added condition of proper resolution of drop-in and drop-out error events is applied.

FIG. 19 is a sharing diagram for the sample sequence model of FIG. 18 under the condition that all error events of distance less than or equal to the square root of 2 are resolved properly with a path length of $P=10$. This same sharing diagram applies when the added condition of proper resolution of drop-in and drop-out error events is applied. Like FIG. 14, FIG. 19 shows that there is a unique minimum-ACS grouping: i.e. states 1 with 2; and states 3 with 4.

Figure 20:
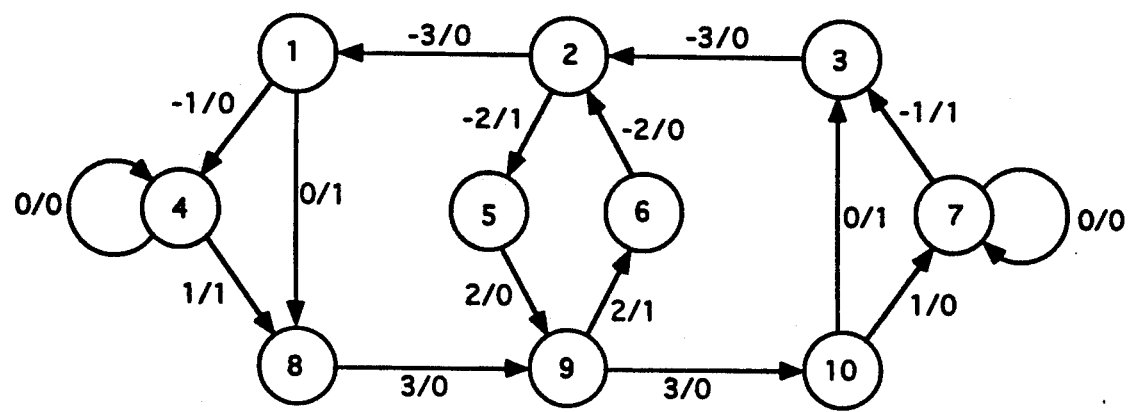
FIG. 20 is a sample sequence model state diagram for an RLL constraint of d=1 and a signal model given by the polynomial $(1-D)(1+D)^3$. The corresponding expected sample sequence for an isolated transition is 1, 3, 3, 1.

FIG. 20 is a sample sequence model for an RLL constraint of $d=1$ and a signal model having a partial-response polynomial of $(1-D)(1+D)$ 3. The corresponding expected sample sequence for an isolated medium transition is 1, 3, 3, 1. Again using for reference purposes, a "0" for one state of the media from which the signal was produced and a "1" for the other state, the numbered states of FIG. 20 may be given the following representations:

| State Number | Media State Sequences |
|---|---|
| 1 | 1000 |
| 2 | 1100 |
| 3 | 1110 |
| 4 | 0000 |
| 5 | 1001 |
| 6 | 0110 |
| 7 | 1111 |
| 8 | 0001 |
| 9 | 0011 |
| 10 | 0111 |

Figure 21:
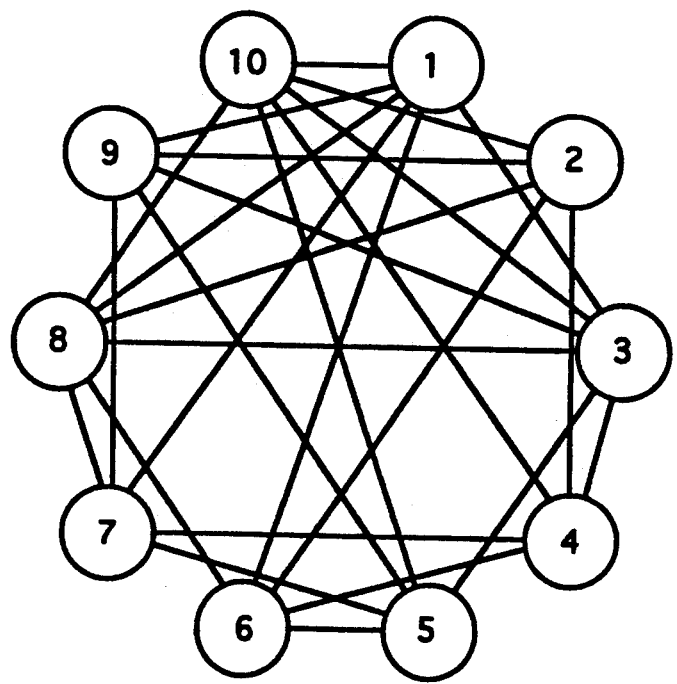
FIG. 21 is a sharing diagram for the sample sequence model of FIG. 20 under the condition that all error events of distance less than or equal to the square root of 10 are resolved properly, with a path length of P=11.
Figure 22:
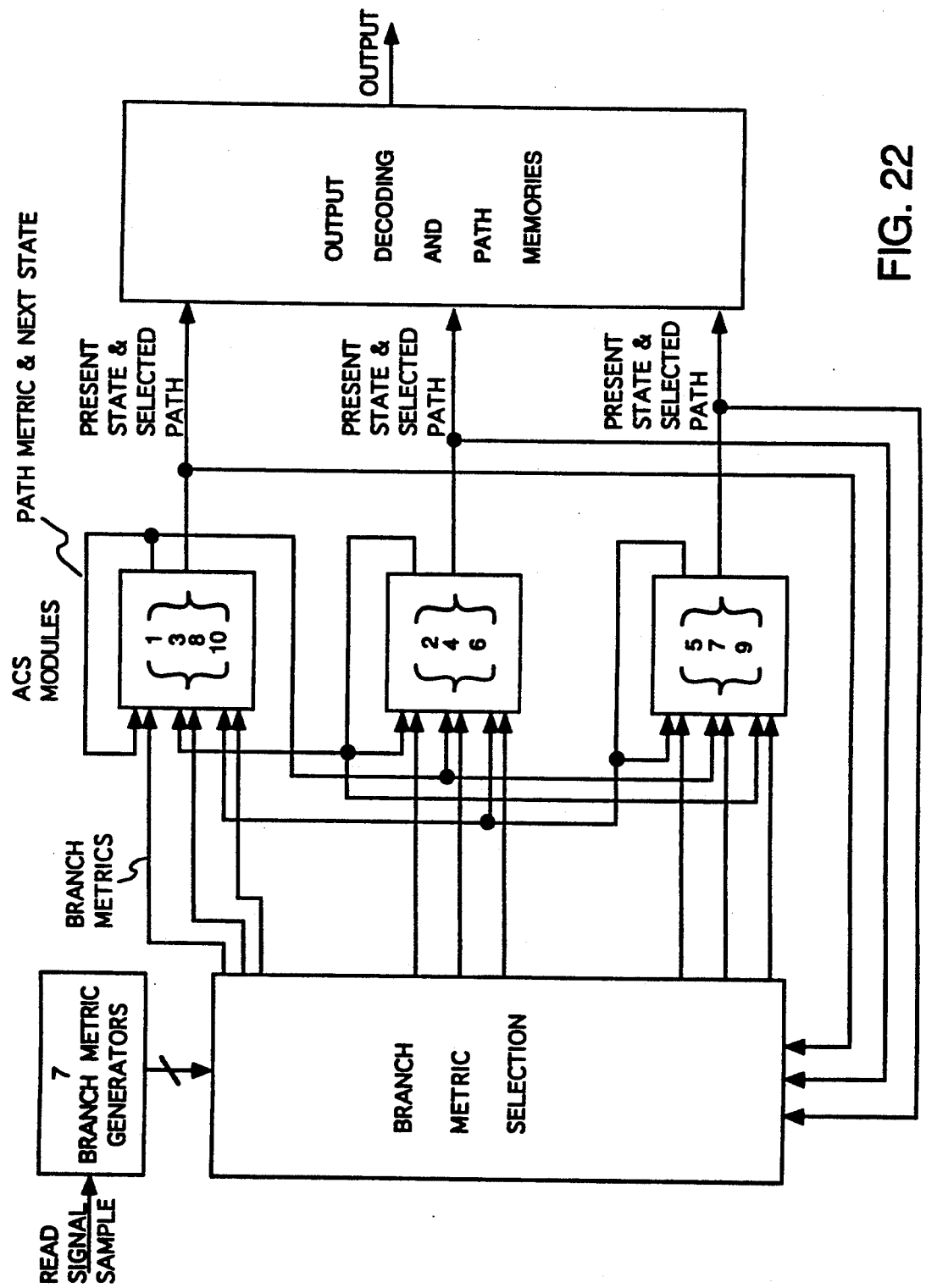
FIG. 22 is a block diagram of an implementation of a Viterbi demodulator for the sample sequence model of FIG. 20 simplified to use only three ACS modules as taken from the sharing diagram of FIG. 21

FIG. 21 is a sharing diagram for the sample sequence model of FIG. 20 under the condition that all error events of distance less than or equal to the square root of 10 are resolved as they would be by the full Viterbi demodulator, with a path length of P=11. The sharing diagram of FIG. 21 indicates that the states can be grouped in the following three groups each sharing an ACS module: 1, 3, 8, and 10; 2, 4, and 6; 5, 7, and 9. It is also clear that no grouping can be made into less than three sharing groups, since states 1, 2, and 5 have no connections with one another and must end up in separate groups. FIG. 22 is a block diagram of such a three-ACS implementation.

Figure 23:
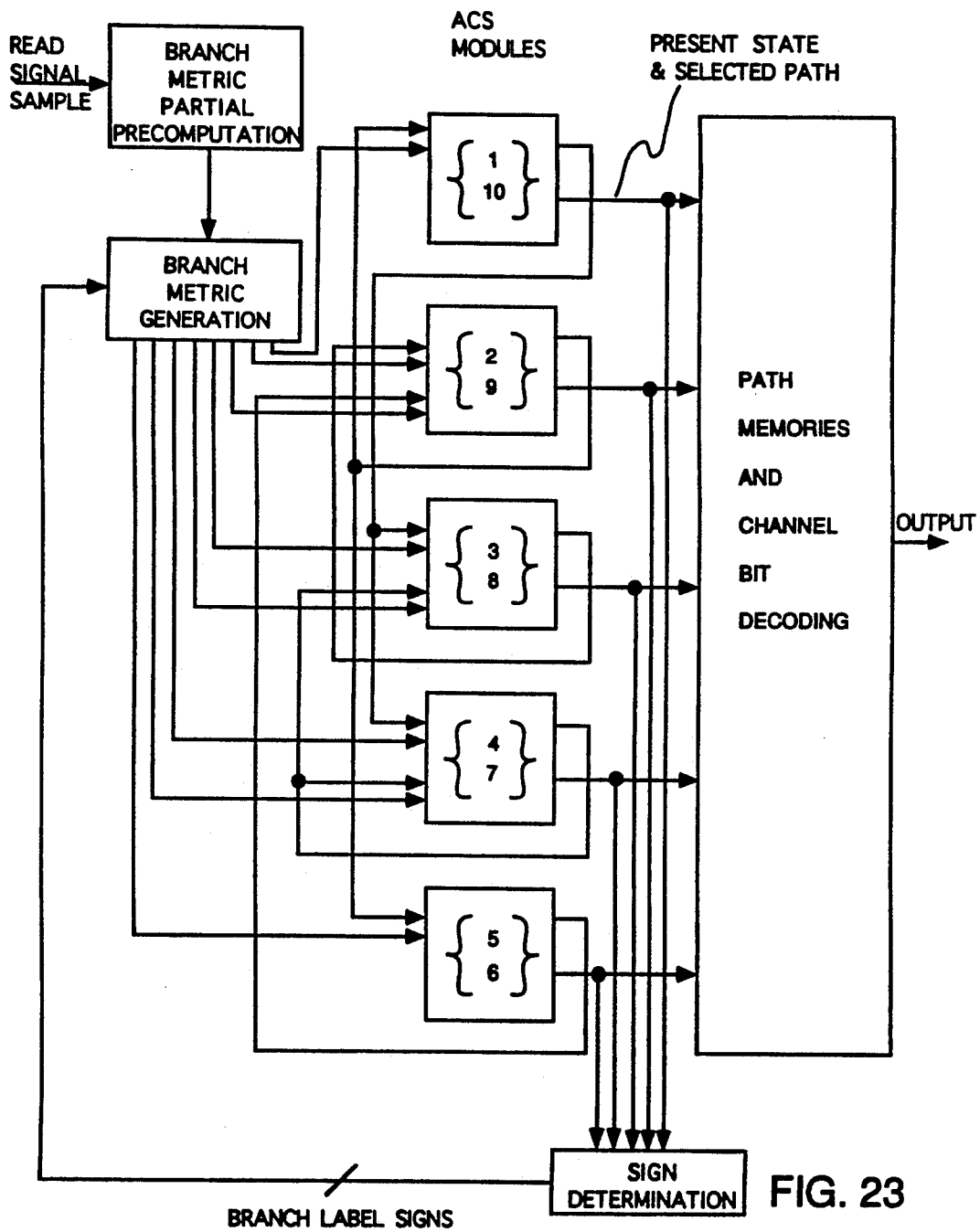
FIG. 23 is a block diagram of an implementation of a Viterbi demodulator for the sample sequence model of FIG. 20 simplified to use five ACS modules as taken from the sharing diagram of FIG. 21.

There are many sharing arrangements for the sample sequence model of FIG. 20 that have four or more ACS modules. One of special significance is the pairing: 1 and 10, 2 and 9, 3 and 8, 4 and 7, 5 and 6. This arrangement requires five ACS modules to implement, but has the advantage that the magnitude of all expected samples within the same sequence-model transition is constant regardless of the current sequence-model state within the sequence-model model state group. This may allow the branch metrics to be partially precomputed with minimal additional hardware, which may reduce the time required for each iteration to be processed, because only the sign of the expected sample depends on the current sequence-model state. FIG. 23 is a block diagram of such a five-ACS implementation.

Figure 24:
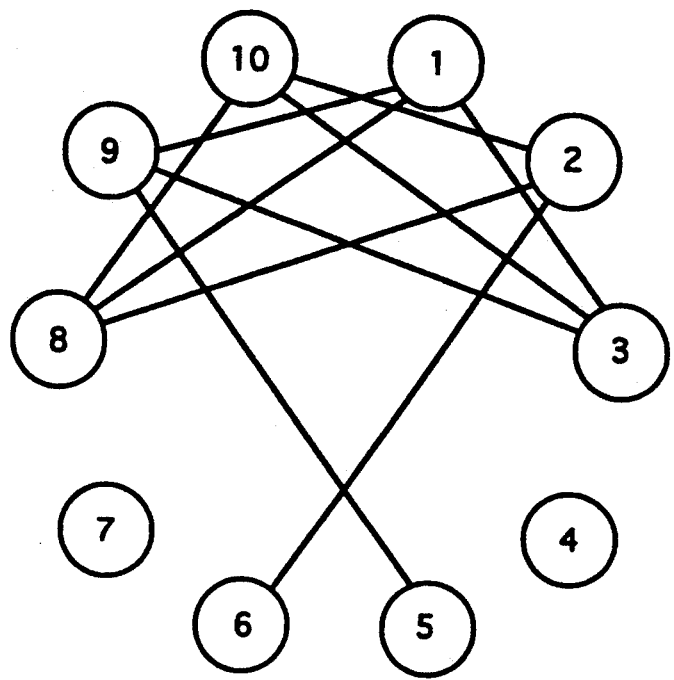
FIG. 24 is a sharing diagram like FIG. 21 with the added condition that all drop-in and drop-out error events are resolved properly.

FIG. 24 is a sharing diagram of the sample sequence model of FIG. 20. It uses the conditions of FIG. 21 with the added condition that all drop-in and drop-out error events are properly resolved. One minimum-ACS groupings for this sample sequence model requires the following 6 ACS modules: states 1 and 8; states 2 and 6; state 3 and 10; states 5 and 9; state 4; and state 7.

Figure 25:
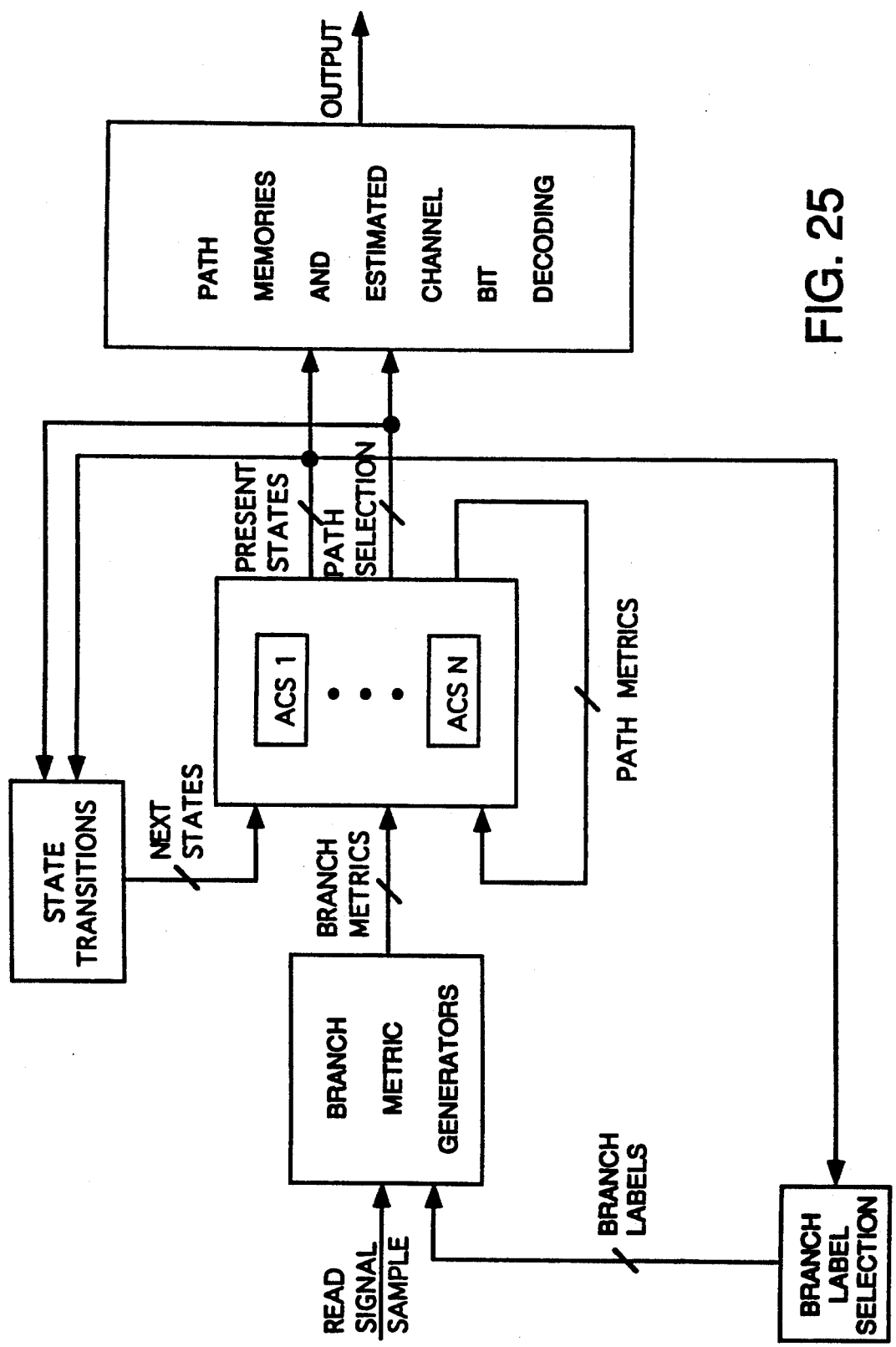
FIG. 25 is a generic block diagram of a sequence demodulator with shared ACS modules.

FIG. 25 is a generic block diagram of a sequence demodulator in which some or all of the ACS modules are associated with multiple states. The state transitions block determines, for each ACS module at each iteration, which of its associated states it should represent at the next iteration based on the selected branch into that ACS module and the present state of the ACS module from which the selected branch originates. The branch label selection block determines the appropriate branch labels for each branch based upon the present state represented by the ACS module from which the branch originates.

In general, trade-offs may need to be made between the complexity reductions allowed by this invention and other considerations such as circuit timing. For example, the 5-ACS implementation of FIG. 23 may have advantages over the apparently less complex 3-ACS implementation of FIG. 22.

DROP-OUT AND DROP-IN ERROR EVENTS

One of the non-ideal aspects of some media, of some magnetic recording media for example, is the presence of small regions on the medium that do not make transitions, e.g. magnetize, as desired. Such a medium defect can result in the attenuation or complete suppression of the analog read signal over a small time interval. Or, it may result in spurious pulses in the analog read signal caused by the transition between a magnetized region and a defect region. A drop-out error is an error in which a written transition is not detected, while a drop-in error is an error in which a transition is falsely detected where none was written. In a situation where medium defects tend to cause drop-out or drop-in errors, it may be important for the sequence demodulator to handle drop outs and drop ins to the best of its ability. If so, drop-out and drop-in errors need to be characterized and included in the set of error events for which the reduced-complexity detector performs as well as the full Viterbi detector.

We characterize an error event as a drop-out if the estimated channel bit sequence contains a 0 indicating no transition in every position where the correct channel bit sequence contains a 0, and if the estimated channel bit sequence contains zeros in one or more positions where the correct channel bit sequence contains a 1 indicating that a transition was written. An error event is characterized as a drop-in when the same error event would be a drop-out if the roles of the correct and estimated channel bit sequences were reversed. Since either path in an error event is a legal choice for the correct path, the inclusion of all drop-out error events in the subset of interest automatically includes all drop-in error events. The events that are not included are those that represent some combination of drop-outs and drop-ins within the same error event. The sharing diagrams in FIG. 15 and FIG. 24 show the allowable sharing of ACS modules for two different signal models when drop-out and drop-in error events are included in addition to minimum distance error events.

FINITE STATE MODELS FOR NONLINEAR CHANNELS

Partial-response channels are linear systems, but the use of a finite state machine model for a signal source does not necessarily presuppose a linear system. Whether or not a state machine represents a linear system, a Viterbi detector may be built to match the state machine model and select surviving paths through the associated trellis. The present invention applies to such detectors for nonlinear channels just as well as it applies to Viterbi detectors for linear channels.

Figure 26:
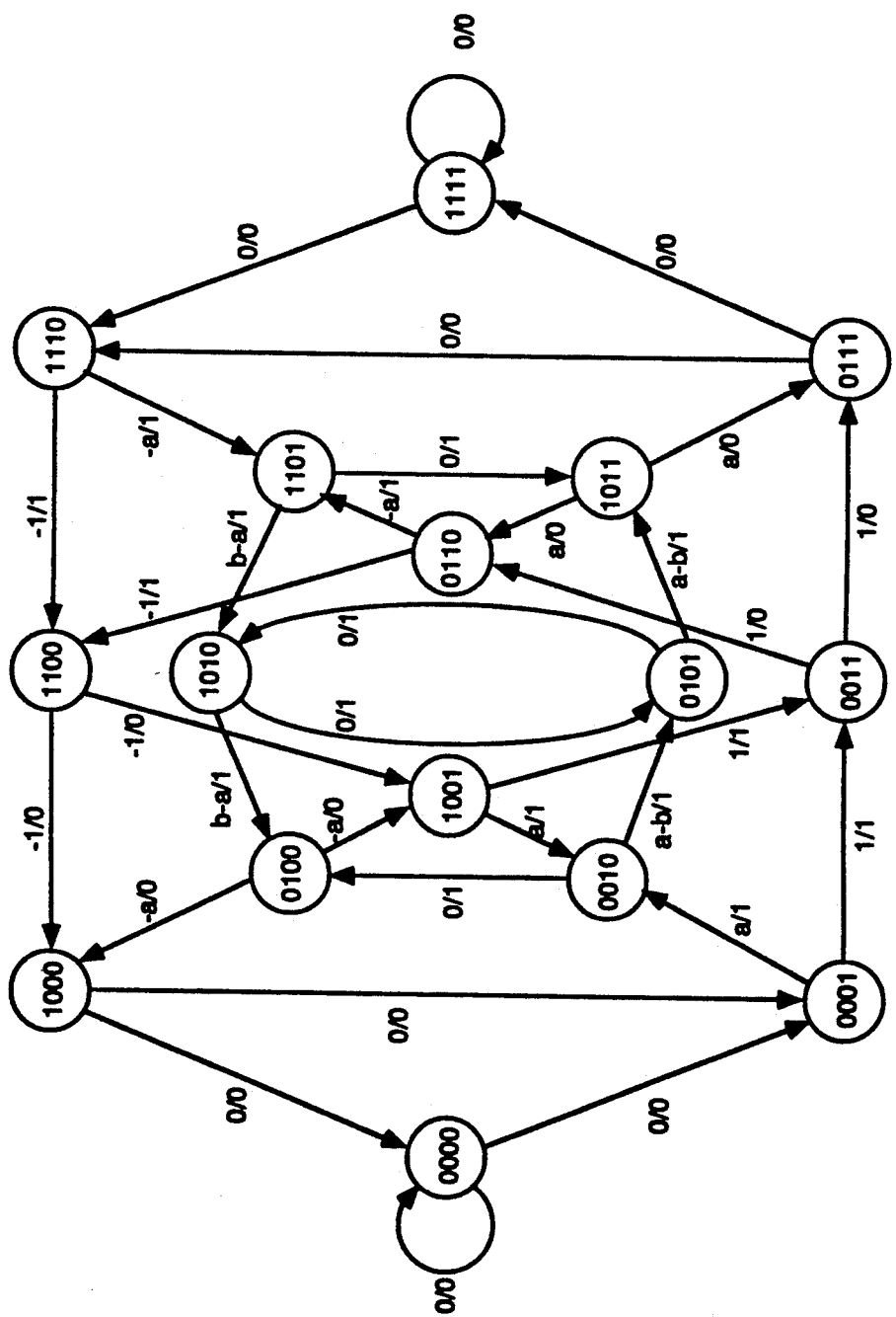
FIG. 26 is a sample sequence model for a nonlinear write/medium/read system.

FIG. 26 shows a sample sequence model for a system with a nonlinear write/transmit channel, medium response, and/or read/receive channel. The type of nonlinearity described here is a simplification of a nonlinearity actually exhibited by some hard disk media at high recording densities. The sampled response of this system to an isolated transition is 0, 1, 1, 0, as would be the case for a PR4 channel. But because of system nonlinearities, adjacent transitions mutually reduce the amplitude of the readback pulses for each transition by an amount greater than would be predicted by linear superposition of the pulses. If a transition has a neighboring transition in the adjacent bit positions on either but not both sides, then its response pulse is reduced in amplitude so that the sample values are 0, a, a, 0 for some a<1. If a transition has neighboring transitions in the adjacent bit positions on both sides its amplitude is further reduced to give sample values of 0, b, b, 0 for some b<a. The binary state labels may represent a four-bit record of the state of the medium. If the location of a transition is associated with the first nonzero sample of the resulting pulse, this state machine incorporates one bit look-ahead in the sense that the rightmost digit in the state label indicates the state of the channel in the bit position following the one whose transition response is just beginning. This is necessary in order to determine whether or not the current transition is reduced in amplitude by a succeeding transition. However, this look-ahead is only conceptual, since we could just as well have associated each transition with the sample just before its response pulse began.

Figure 27:
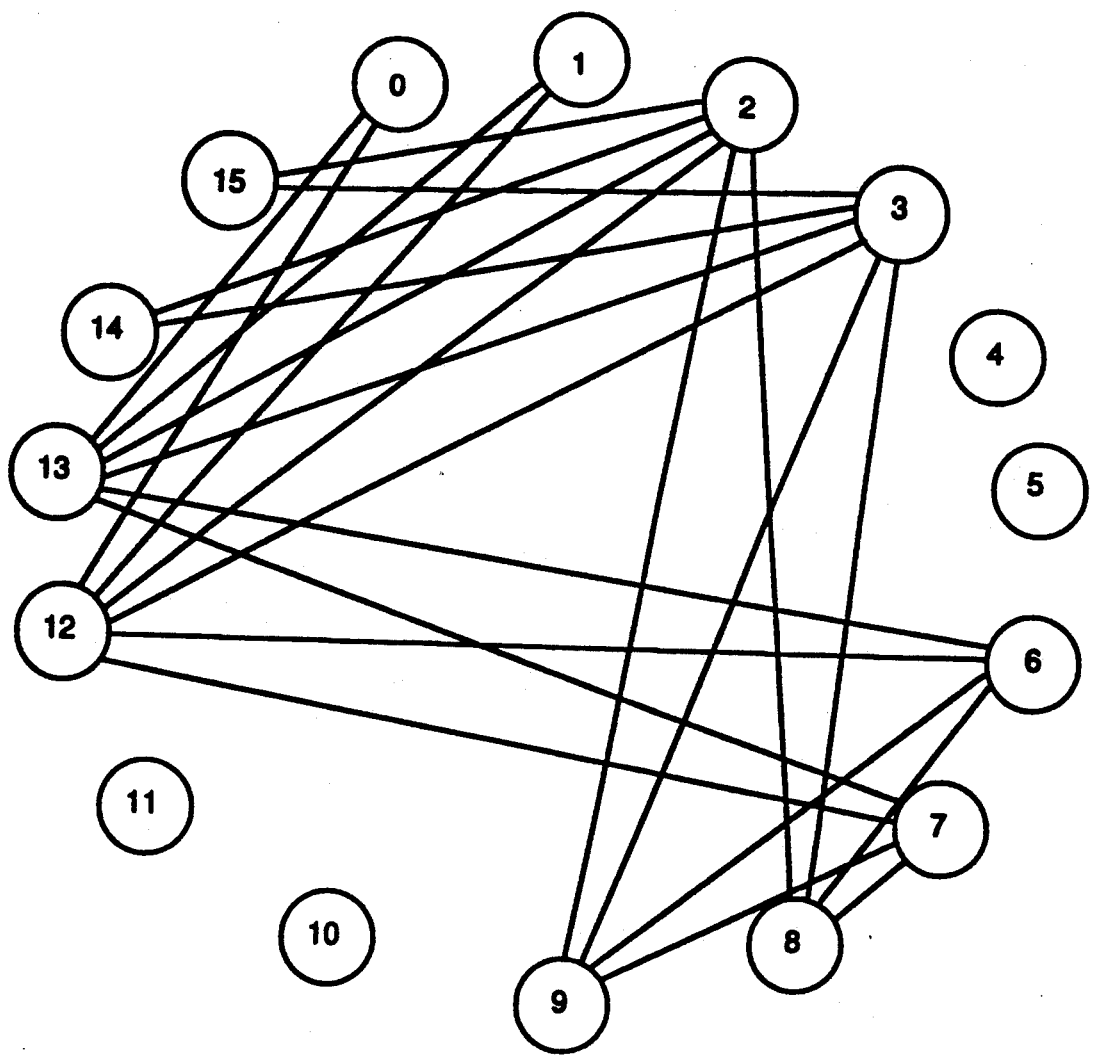
FIG. 27 is a sharing diagram for the sample sequence model of FIG. 26.

The nonlinear behavior modeled in FIG. 26 reduces the minimum distance for this model as compared to the minimum distance for the PR4 model, which is the square root of 2. It also creates a situation in which there are potential error events of distance slightly greater than minimum distance but close enough to minimum distance that it may be important to include them in the set considered to be of interest in Step 3 of the simplification method above. Therefore, the optimal ACS sharing possibilities in the sample sequence model of FIG. 26 depend on the nonlinearity parameters a and b, as well as on the distance chosen as the threshold for error events of interest. They may also depend on the coding constraints, such as RLL encoding, and the path-memory length selected. FIG. 27 shows a sharing diagram for the sample sequence model of FIG. 26 for the case of a=0.85, b=0.7, P=8, and including all potential error events of distance less than or equal to the square root of 2 (the minimum distance of closed potential error events in this case is 0.85 times the square root of 2). The sharing diagram of FIG. 27 shows that a minimum-ACS detector for this sample sequence model can be implemented by 10 ACS modules as follows: states 0 with 13; states 1 with 12; states 2 with 15; states 3 with 14, states 6 with 9; states 7 with 8; state 4; state 5; state 10; and state 11.

SIMPLIFIED SOFTWARE IMPLEMENTATION OF VITERBI SEQUENCE DETECTORS

In situations where the information rate is low relative to the instruction execution rate of an available processor, it is possible to demodulate samples of an analog read signal using a multipurpose processor executing appropriate software. While such an implementation does not have ACS modules, where a "module" is a hardware unit, is does have ACS routines that perform, as a sequence of instructions on the processor, a series of add, compare, select functions that are equivalent to the functions of a hardware ACS module. The techniques presented herein are applicable to reduce the number of executions of such ACS routines required to process each sample taken, thus speeding up the maximum sample rate that a given processor can support. It is possible that this speed up could, in a particular situation, make a software implementation of a Viterbi demodulator practical whereas without the simplification of the present invention and its associated speedup a hardware demodulator would have been required. Besides the potentially lower implementation cost of such a software demodulator, a software implementation would provide potentially very advantageous flexibility in the choice of sample models and encoding constraints.

SAMPLE-MODEL PROGRAMMABILITY

Figure 28:
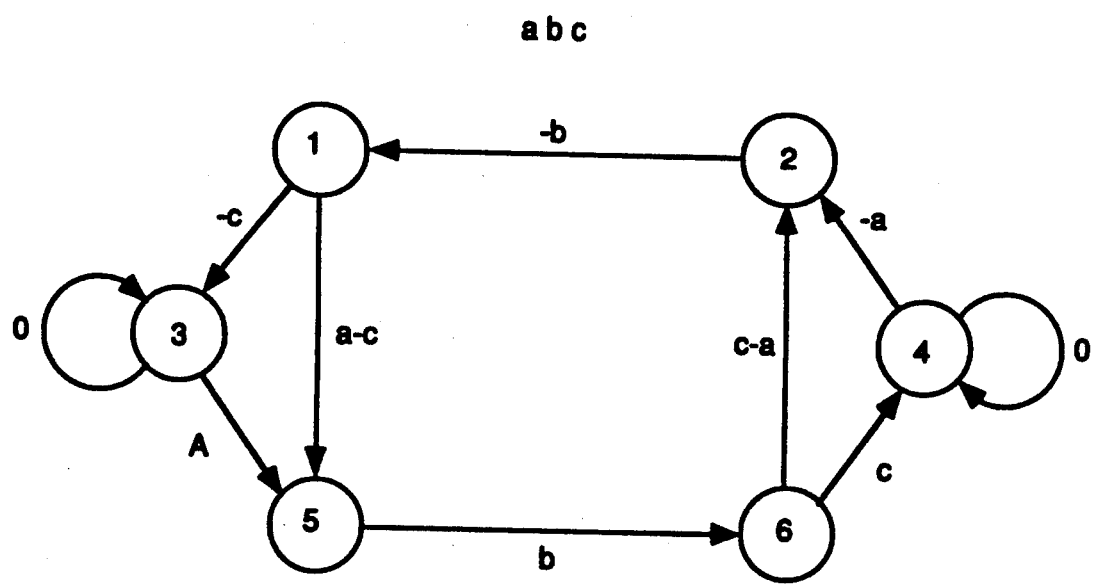
FIG. 28 illustrates a six state machine model with a programmable expected sequence of samples.
Figure 29:
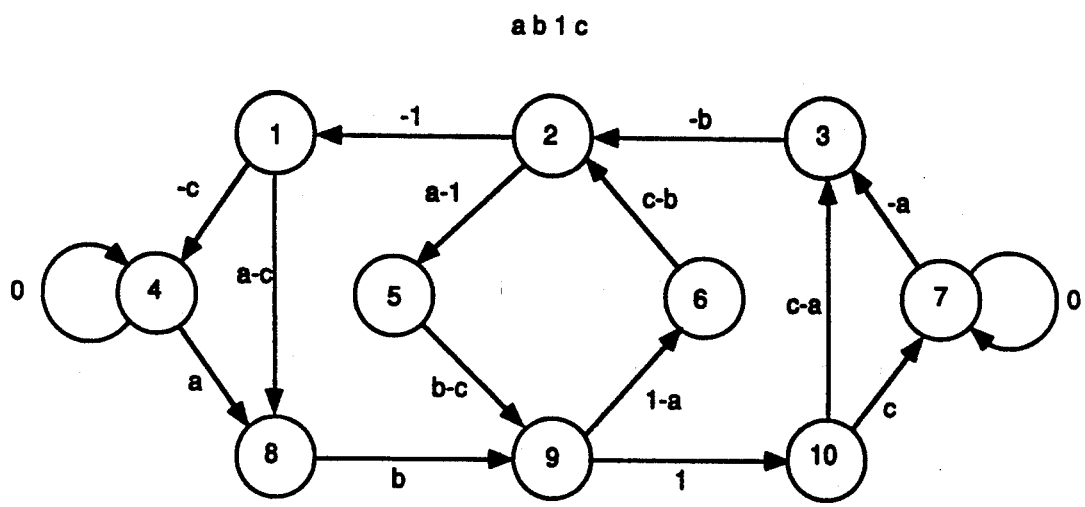
FIG. 29 illustrates a ten state machine model with another programmable expected sequence of samples.

For some applications, it is preferable to implement a sequence detector such that one can vary the sample sequence expected due to an isolated transition. FIG. 28 illustrates a six state machine model with a programmable expected sequence of samples a, b, c, and FIG. 29 illustrates a ten state machine model with another programmable expected sequence of samples a, b, 1, c. The sample sequence a, b, 1, c can fit any signal model of 4 or fewer samples per isolated medium transition. The values of a, b, and c should be allowed to range from, say 0 to 2, so that they can be chosen such that the constraint that the third expected sample is 1 is a mere matter of normalization. For example, allowing a and c to range from 0 to approximately 0.5 and allowing b to range from 0 to approximately 2, allows the sequence a, b, 1, c to cover any pulse shape that may reasonably be expected to be produced by inductive magnetic read heads over a range of recording densities.

A significant implication of the programmability of the 4-sample detector involves combining some of the special cases that were treated in the prior art as quite distinct. If one sets a, b, 1, c to 0, 1, 1, 0 one has a detector for PR4. If one sets a, b, c to 0, 0.5, 1, 0.5 one has a detector for EPR4. The point is that PR4 and EPR4 and 4-samples would ordinarily each have their own distinct state machine model, and thus their own architecture of ACS modules. The sample model programmability of the present invention supports the PR4 or the EPR4 (or one of numerous other signal models) cases with a single detector or demodulator architecture.

The use of a programmable sequence detector allows a great variety of retry strategies to be implemented. When used in combination with a programmable equalizer, different equalization targets can be set for both the detector and the equalizer for attempted rereads of a data record. For example, one could begin with the detector set for a side-sampled isolated pulse of 1, 3, 3, 1 and the equalizer programmed to provide such a pulse. Upon failure to read a data record one could then switch to the center-sampled pulse of 1, 2, 1, alter the equalizer to provide such a pulse and attempt to read the data record again.

The use of a programmable sequence detector also has the benefit that the optimum equalization target may not be the same for every part of the recording medium. The inside track of a magnetic disk may need a different pulse shape for best performance than the outside track. Also, for disks with multiple heads and recording surfaces, the optimum pulse shape may be different for each head. A programmable detector allows each track of each recording surface to be read with its own optimal set of parameters.

A programmable sequence detector may be built using the ACS sharing principles of this invention. In this case, care should be taken to insure that the chosen sharing arrangement is allowed for all possible programmed values of the expected samples.

MULTIPLE-SAMPLES PER SEQUENCE-MODEL STATE TRANSITION

Sometimes the required sample rate and corresponding channel bit rate exceed the maximum ACS module cycle rate, i.e. the rate at which a particular implementation of an ACS module can accept new actual sample values and select surviving paths. When this occurs, a means is needed to restructure the computations so that more processing may be done in parallel. This can be accomplished in a sequence detector by beginning with a suitably modified sample sequence model.

Consider the case where a doubling of the rate at which an ACS module processes read-signal samples is sufficient. In this case, the sample sequence model is modified by considering each pair of possible consecutive sequence model transitions as a single state transition in the modified sample sequence model. All sequence-model transitions of the modified sample sequence model represent all possible consecutive pairs of transitions from the original sample sequence model. The modified detector accepts a pair of samples of the analog read signal, generates branch metrics by comparing the received sample pair to expected sample pairs for each branch, adds the compound branch metrics to previous path metrics and selects the surviving paths. In effect, the sample sequence model is modified to accept and process multiple samples per state transition, and the fundamental frame of the corresponding trellis is replaced by a modified fundamental frame whose branches represent all paths through two consecutive fundamental frames of the original trellis.

The advantage of this modification is that the add, compare, select process can operate at one half of the sample rate. The cost of this modification is that the compound branch metrics are more complex to compute and that there may, in general, be more paths entering each ACS module. The comparisons among the greater number of path metrics may be carried out in parallel, as may the computation of the compound branch metrics. As will be clear to one skilled in the art, an analogous modification can be used to process 3 or more samples in parallel per cycle of the ACS module.

Figure 30:
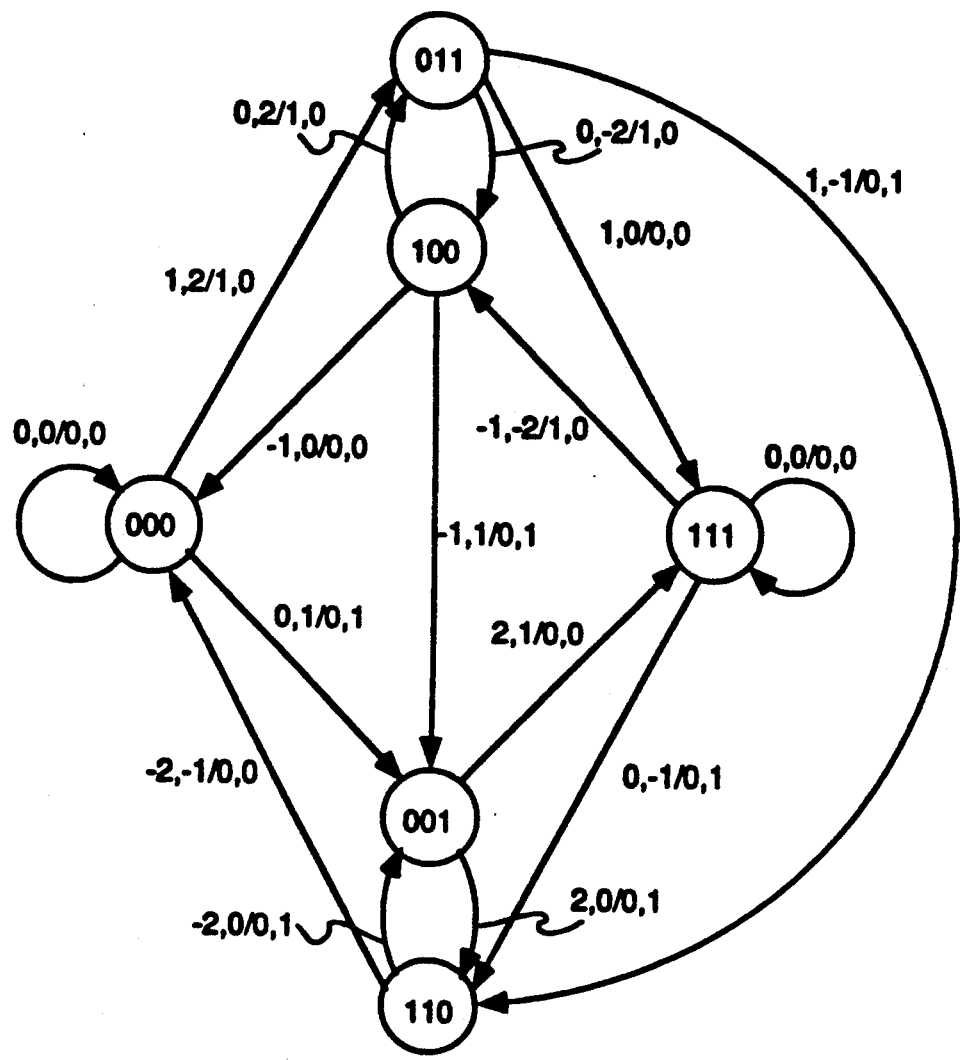
FIG. 30 shows a six-state modified sample sequence model for EPR4 with a minimum run length constraint of d=1, each sequence model transition in FIG. 30 representing the combination of two consecutive sequence model transitions in the unmodified sample sequence model of FIG. 3.

FIG. 30 shows a six-state modified sample sequence model for EPR4 with a minimum run length constraint of $d=1$. This model differs from FIG. 3 in that each sequence-model transition in this model represents the combination of two consecutive sequence model transitions in the unmodified sample sequence model of FIG. 3. The labels in FIG. 30 indicate pairs of expected samples and pairs of corresponding estimated channel bits.

Figure 31:
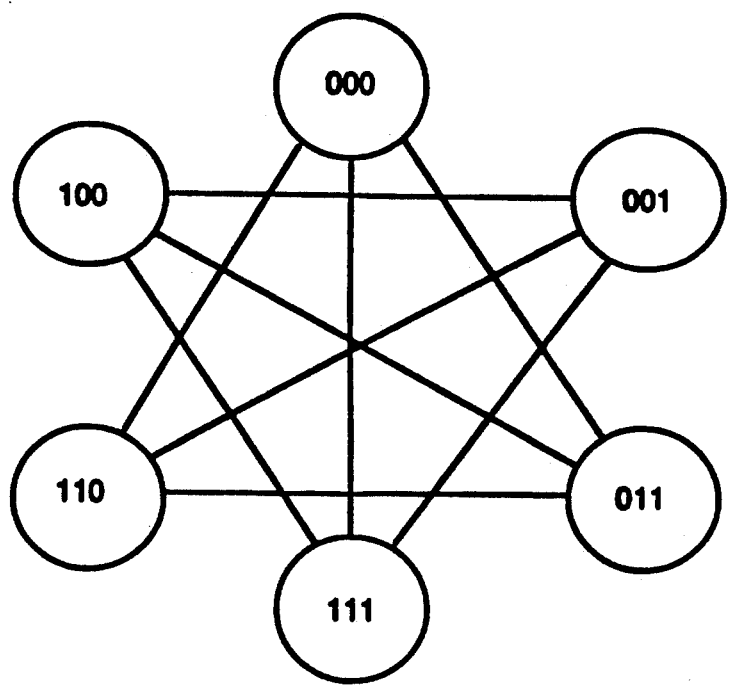
FIG. 31 is a sharing diagram for FIG. 30 for the condition that all potential error events of distance less than or equal to 2 be handled properly.

FIG. 31 is a sharing diagram obtained when we require that all potential error events of distance less than or equal to 2 be handled properly. The longest potential error event at this distance spans six frames of the original single-sample trellis. The same potential error event may span parts of four frames in the double-sample trellis, so for this sharing diagram the path length was taken as $P=8$, meaning that potential error events up to eight samples long were considered. Since the samples are processed in pairs, only potential error events of even length are considered. Note that the sharing allowed in this case is identical to the sharing allowed when the same sample sequence model is applied one sample at a time.

Figure 32:
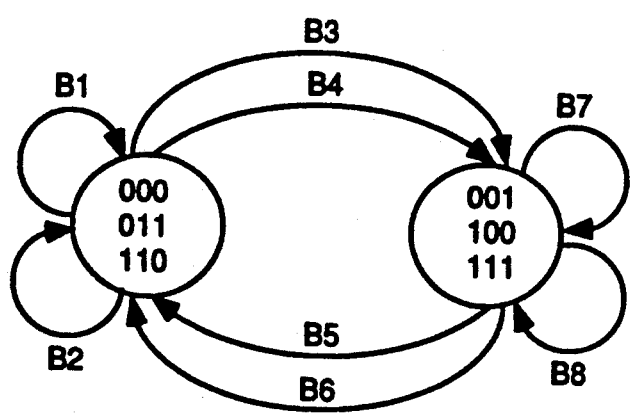
FIG. 32 is a diagram showing how states from FIG. 30 may be grouped to share two ACS modules.

Both grouping of sequence-model states to share ACS modules and modification of sample sequence models to process multiple samples per transition can be implemented in the same sequence detector. FIG. 32 is a diagram showing how states from FIG. 30 may be grouped to share two ACS modules. Each ACS module handles four input paths. Note that there are parallel paths in the figure. For example, if state 011 is currently represented by the ACS module for the left-hand group of states, then branch B3 represents a branch from 011 to 100 with a label 0, $-2/1$, 0, while branch B4 represents a branch from 011 to 111 with a label 1, 0/0, 0. Each of these branches represents a possible sequence model transition and both must be considered when the surviving path is selected by the ACS module to which they go. FIG. 32 implies an architecture with which a sequence detector may be implemented for EPR4 signals with $d=1$ at a processing rate of one-half the sample rate.

Figure 33:
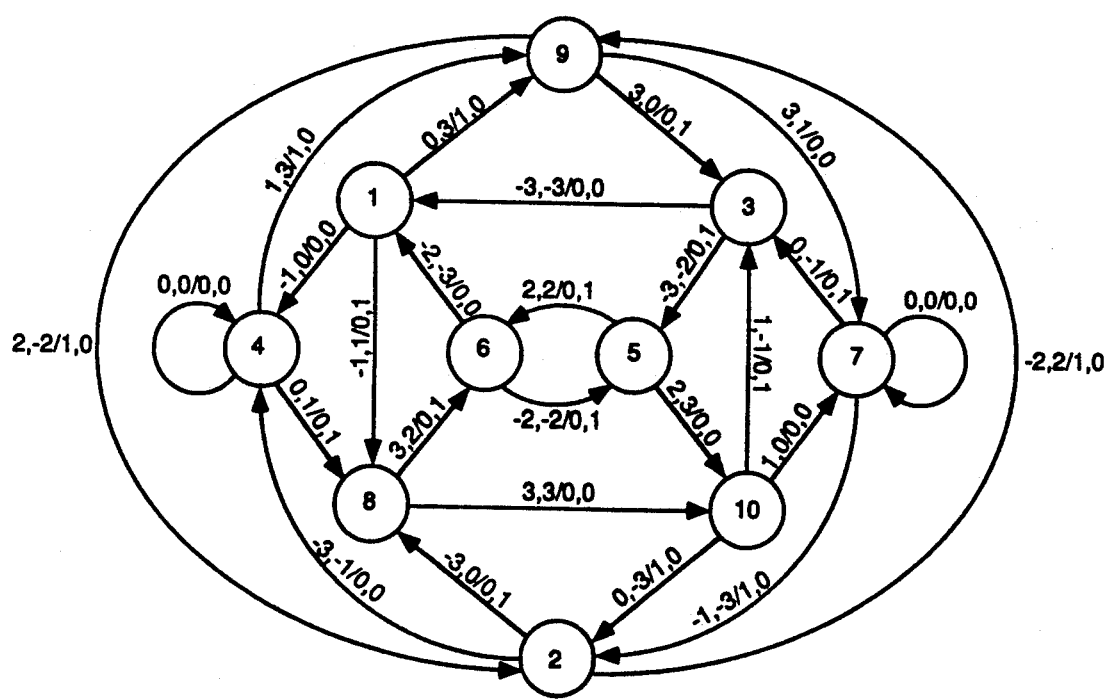
FIG. 33 shows a ten-state modified sample sequence model for partial response signals corresponding to the polynomial $(1-D)(1+D)^3$ with a minimum run length constraint of d=1, each sequence model transition in FIG. 33 representing the combination of two consecutive sequence model transitions in the original model of FIG. 20.

FIG. 33 shows a ten-state modified sample sequence model for partial response signals corresponding to the polynomial $(1-D)(1+D)\pm 3$ with a minimum run length constraint of $d=1$. This model is modified from FIG. 20 in that each sequence model transition in the modified model represents the combination of two consecutive sequence model transitions in the original model of FIG. 20. The labels in FIG. 33 indicate pairs of expected samples and pairs of corresponding estimated channel bits. Again using for reference purposes, a "0" for one state of the media from which the signal was produced and a "1" for the other state, the numbered states of FIG. 33 may be given the following representations:

| State Number | Media State Sequences |
|---|---|
| 1 | 1000 |
| 2 | 1100 |
| 3 | 1110 |
| 4 | 0000 |
| 5 | 1001 |
| 6 | 0110 |
| 7 | 1111 |
| 8 | 0001 |
| 9 | 0011 |
| 10 | 0111 |

When the sample sequence model of FIG. 33 is analyzed to determine allowable sharing of ACS modules, the result is the same as for the single-sample case. For proper resolution of all potential error events of distance less than or equal to the square root of 10, the sharing diagram is as shown in FIG. 21.

Figure 34:
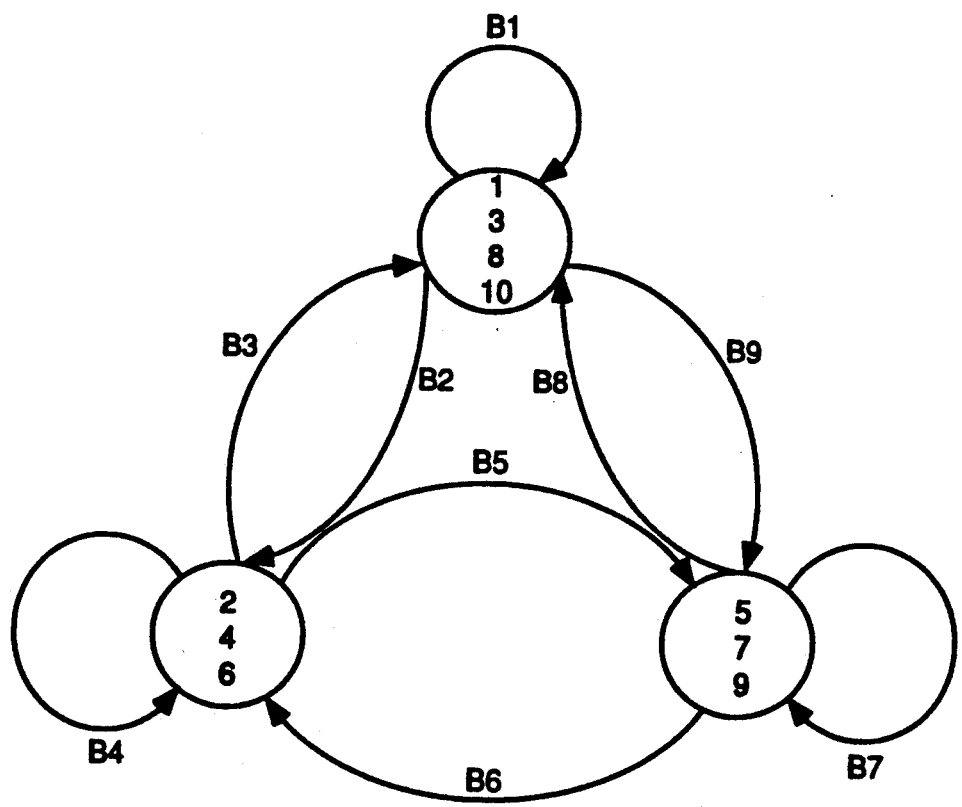
FIG. 34 is a diagram showing how states from FIG. 33 may be grouped to share three ACS modules.

FIG. 34 is a diagram showing how states from FIG. 33 may be grouped to share three ACS modules. Each ACS module handles three input paths. In this case, no parallel paths are required. FIG. 34 implies an architecture with which a sequence detector may be implemented for partial response signals corresponding to the polynomial $(1-D)(1+D)\pm 3$ with $d=1$ at a ACS module cycle rate of one-half the sample rate.

Figure 35:
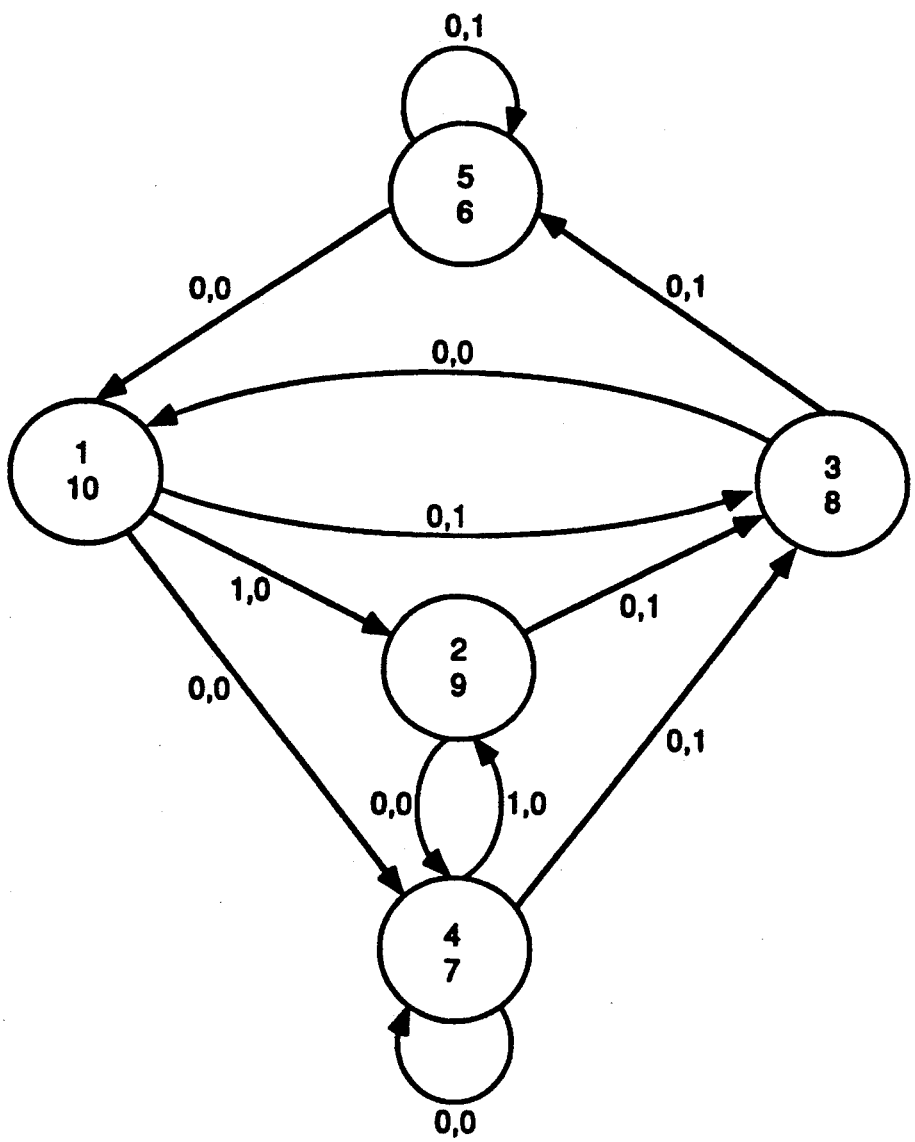
FIG. 35 is a diagram showing how states from FIG. 33 may be grouped to share five ACS modules.

FIG. 35 is a diagram showing how states from FIG. 33 may be grouped to share five ACS modules. Each ACS module handles two or three input paths, and no parallel paths are required. FIG. 34 shows how a sequence detector may be implemented for partial response signals corresponding to the polynomial $(1-D)(1+D)\pm 3$ with $d=1$ at an ACS module cycle rate of one-half the sample rate. As in the unmodified or single-sample case, the branch labels in this architecture only depend on their state of origin for their signs, allowing partial precomputation of the branch metrics.

Figure 36:
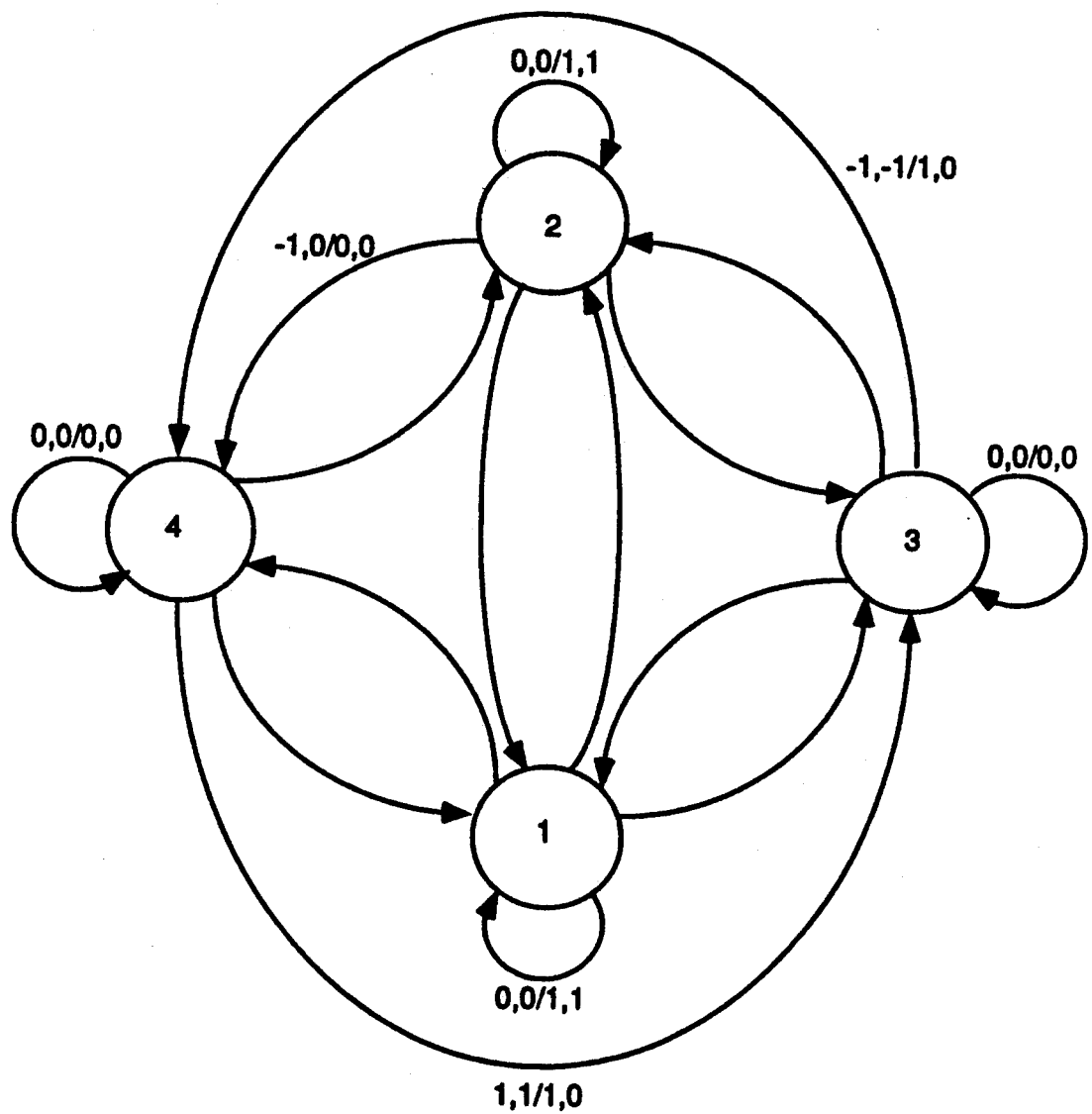
FIG. 36 shows a modified four-state sample sequence model for PR4 signals without run length constraints, differing from FIG. 13 in that each sequence model transition in this model represents the combination of two consecutive sequence model transitions in the original model of FIG. 13.

FIG. 36 shows a modified four-state sample sequence model for PR4 signals without run length constraints. This model differs from FIG. 13 in that each sequence model transition in this model represents the combination of two consecutive sequence model transitions in the original model of FIG. 13. The labels in FIG. 36 indicate pairs of expected samples and pairs of corresponding estimated channel bits. Using for reference purposes, a "0" for one state of the media from which the signal was produced and a "1" for the other state, the numbered states of FIG. 36 may be given any representation, as one can pass from any state to any state, including the same state. For example, the following representation is applicable:

| State Number | Media State Sequences |
|---|---|
| 1 | 01 |
| 2 | 10 |
| 3 | 11 |
| 4 | 00 |

When the sample sequence model of FIG. 36 is analyzed to determine allowable sharing of ACS modules, the result is the same as for the single-sample case. For proper resolution of all potential error events of distance less than or equal to the square root of 2, the sharing diagram is as shown in FIG. 14.

Figure 37:
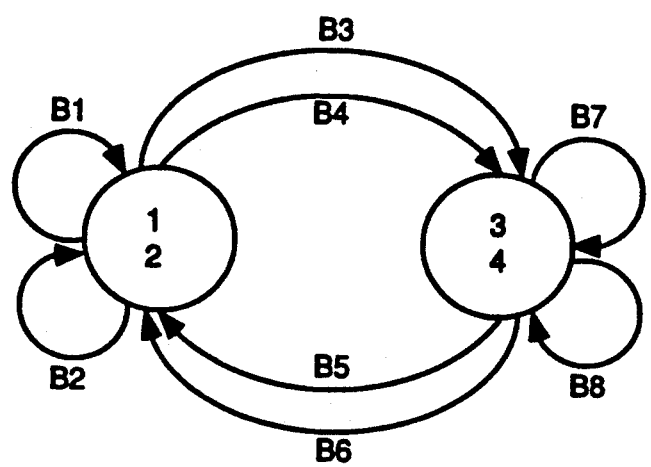
FIG. 37 is a diagram showing how states from FIG. 36 may be grouped to share two ACS modules.

FIG. 37 is a diagram showing how states from FIG. 36 may be grouped to share two ACS modules. Parallel paths are required, and each ACS module handles four input paths. FIG. 37 shows how a sequence detector may be implemented for PR4 at an ACS module cycle rate of one-half the sample rate. Note that in the prior art, sequence detectors for PR4 have been built by de-interleaving the sample sequence into two subsequences, each of which is demodulated independently using a Viterbi detector for a $(1-D)$ partial response signal. The processing rate in each interleave is one-half the sample rate. This de-interleaved demodulation is possible for PR4 because the PR4 polynomial $(1-D)(1+D)=(1-D^2)$ contains only even powers of D, and therefore the dependence between samples is restricted to samples in the same interleave. The present invention gives an alternative way to achieve parallelism and reduce the processing rate in PR4 sequence demodulators.

In the claims to follow, the word detector is used in the general sense to denote any sequence detector, whether used for demodulation, decoding or otherwise.

While preferred and alternate embodiments of the present invention have been disclosed and described in detail herein, it will be obvious to those skilled in the art that various changes in form and detail may be made therein without departing from the spirit and scope thereof.

Appendix A

MATLAB PROGRAM

```
% script file shareacs.m generates a list of codewords for a given state
% machine and identifies all error events (starting in the same state and
% differing in the first transition).  Then it goes through all error
% events, screens them against some specified criteria, and determines
% which states in the state machine can share an ACS unit and path memory
% without compromising the detector's ability to handle the specified set
% of error events.  It can also analyze the allowable sharing under the
% conditions that 2 or more samples are processed per clock cycle.
%
% The state machine is described by a combined transition/input matrix, A,
% The matrix is square, and the i,j element is the expected sample for the
% path from state i to state j.  If there is no path from state i to state
% j, the matrix A should contain a NaN in the i,j position.  A corresponding
% matrix O gives estimated channel bit for each transition specified in A
% (the elements of O that don't correspond to transitions in A are don't
% cares).
%
% Richard T. Behrens, February 1992.
%
```

```
format compact
%
% Accept user input to define the problem:
%
clc
A = input('Enter the state transition/input matrix: ');
O = input('Enter the output matrix: ');
nclock = input('Enter the number of samples to process per clock
cycle:   ');
Nmax = input('Enter the decoder path length: ');
if (rem(Nmax,nclock)~=0)
    error('Path length must be a multiple of the number of samples
per clock.')
end
normtype = input('Enter the desired norm (use 2 for Euclidean): ');
disp('Now specify what types of error events you want to include:
')
disp('        (1) Events with distance <= a given "critical" distance.
')
disp('        (2) Events that can be characterized as dropouts.')
disp(' ')
critdist = input('Enter the "critical" distance:   ');
savedrop = input('Include dropout errors (0/1)?   ');
if savedrop
    dl = input('Max number of dropped out bits to consider: ');
else
    dropout = 0;
end
tellwhy = input('Do you want examples of why each share is
forbidden (0/1)? ');

n = length(A);             % number of states

[T,I,D] = statconv(A,O,nclock);      % convert the state machine to
another format sharetable = ones(n,n);   % begin by assuming all states are
shareable
for N = nclock:nclock:Nmax     % for each length of codeword
    disp(['Considering codewords of length ' int2str(N)])
    for i = 1:n          % for each starting state ...
        disp(['Working on error events that start in state '
int2str(i)])
        tidx = find(T(:,1)==i);        % find all transitions from
state i
        stateseqs = T(tidx,:)';        % keep track of state sequences
...
        cws = I(tidx,:)';              % and codewords ...
        outputs = D(tidx,:)';          % and channel bits.
        [dummy,M] = size(cws);
        for k = (2*nclock):nclock:N
            newstateseqs = [];
            newcws = [];
            newoutputs = [];
            for j = 1:M
                tidx = find(T(:,1)==stateseqs(k/nclock,j));
                stateseq = stateseqs(:,j)*ones(1,length(tidx));
                newstateseqs = [newstateseqs [stateseq; T(tidx,2)']];
                cw = cws(:,j)*ones(1,length(tidx));
                newcws = [newcws [cw; I(tidx,:)']];
                output = outputs(:,j)*ones(1,length(tidx));
                newoutputs = [newoutputs [output; D(tidx,:)']];
```

```
        end
        stateseqs = newstateseqs;
        cws = newcws;
        outputs = newoutputs;
        [dummy,M] = size(cws);     % codewords of length k from
state i
    end % now we have a list of all M codewords that start from state
i,
    % and we can investigate all the error events that begin in
state i.

for j = 1:(M-1)
        for k = (j+1):M
            if (stateseqs(2,j)~=stateseqs(2,k))    % if pair is an
error event
                dist = norm(cws(:,j)-cws(:,k),normtype);    % find
distance
                if savedrop      % check for dropout/dropin
event
                    dropout =
isdrop(outputs(:,j),outputs(:,k),dl);
                    dropout =
dropout|isdrop(outputs(:,k),outputs(:,j),dl);
                end
                if (dist<critdist)|dropout   % if an event of
interest
                    sti = 2;    % start at the beginning of the
error event
                    while (sti<=(N/nclock+1))    % until the event
closes
                        if (stateseqs(sti,j)~=stateseqs(sti,k))
                            stj = stateseqs(sti,j);
                            stk = stateseqs(sti,k);
                            if sharetable(stj,stk)
                                sharetable(stj,stk) = 0; % share not
allowed
                                disp(['Marking nonshareable state
pair: ' ...
                                    int2str(stj) ', '
int2str(stk)])
                                if tellwhy
                                    disp('An error event needing this
pair: ')
                                    disp('Codewords: ')
                                    disp([cws(:,j) cws(:,k)]')
                                    disp('State sequences: ')
                                    disp([stateseqs(:,j)
stateseqs(:,k)]')
                                    disp('Outputs: ')
                                    disp([outputs(:,j) outputs(:,k)]')
                                    disp(['Distance = '
num2str(dist)])
                                    if dropout
                                        disp('This is a dropout
event.')
                                    end
                                    pause
                                    clc
                                end
```

```
                    end
                    sti = sti + 1;
                else
                    break
                end
              end
             end
            end
           end
          end
         end
        end
       end
end clc
    sharetable = sharetable&(sharetable');
    disp('Sharing table: ')
    disp([nan 1:n; [(1:n)' sharetable]])
```

===============================================================
===

```
function dropout = isdrop(out1,out2,dl)
% dropout = isdrop(out1,out2,dl) returns a 1 if the error between
% binary sequences out1 and out2 can be characterized as a dropout,
% otherwise returns a 0.  A dropout is indicated when:
%           (1) every 0 in out1 is 0 in out2 (no drop in or shift)
%   and     (2) at least one 1 in out1 is 0 in out2  (dropout)
%   and     (3) not more than dl 1s in out1 are 0 in out2 (not too
many)
%
% If dl is not supplied, it is taken as infinity.
%
% Richard T. Behrens, February 1992.
%
if nargin<3
    dl = inf;
end
numdrop = sum((out1==1)&(out2==0));
dropout = (~any((out1==0)&(out2==1))) & (numdrop>0) &
(numdrop<=dl);
```

===============================================================
===

```
function [T,I,D] = statconv(A,O,n)
% [T,I,D] = statconv(A,O,n) converts a state machine from the input
format
% used by shareacs.m (and described therein) to a format suitable
to
% describe state machines that process n samples per clock cycle.
The
% new format consists of three matrices.  T is a list of
transitions, with
% one row for every transition path in the machine, and two columns
% containing the state numbers that the transition path comes from
and
% goes to.  I is a list of input labels (expected samples), with
one row
% for every row in T, and one column for every sample processed in
one
% clock cycle (n).  D is a list of output labels (channel bits) in
the
```

```
% same format as I.
%
% Richard T. Behrens, February 1992.
%
ns = length(A);              % number of states T = []; I = []; D = [];
for i = 1:ns                 % for each starting state
   trans = find(~isnan(A(i,:)));    % find valid transitions
   stateseqs = trans;               % keep track of state sequences
...
   cws = A(i,trans);                % and input labels ...
   outputs = O(i,trans);            % and output labels.
   M = length(cws);
   for k = 2:n
      newstateseqs = [];
      newcws = [];
      newoutputs = [];
      for j = 1:M
         trans = find(~isnan(A(stateseqs(k-1,j),:)));
         stateseq = stateseqs(:,j)*ones(1,length(trans));
         newstateseqs = [newstateseqs [stateseq; trans]];
         cw = cws(:,j)*ones(1,length(trans));
         newcws = [newcws [cw; A(stateseq(k-1),trans)]];
         output = outputs(:,j)*ones(1,length(trans));
         newoutputs = [newoutputs [output; O(stateseq(k-
1),trans)]];
      end
      stateseqs = newstateseqs;
      cws = newcws;
      outputs = newoutputs;
      [dummy,M] = size(cws);   % number of codewords of length k
from state i
   end % add the length n codewords to the transition path list
   I = [I; cws'];
   T = [T; [i*ones(M,1) stateseqs(n,:)']];
   D = [D; outputs'];
end
```

============================================================
===

We claim:

1. A sequence detector for signals characterized by a predetermined state machine model having a first number of states, comprising a predetermined second number of add, compare, select (ACS) modules, said second number being less than said first number, at least one of said ACS modules being associated with a plurality of specific predetermined states of said predetermined state machine model so that one ACS module is associated with each state of said predetermined state machine model, each of said ACS modules associated with a plurality of states of said predetermined state machine model having memory means for storing which of the respective associated states said ACS module should represent at any particular time based upon the state associated with said ACS module having the lowest path metric thereto.

2. A sequence detector for signals characterized by a predetermined state machine model having a first number of states, comprising:
   branch metric generator means;
   a second predetermined number of add, compare, select (ACS) modules, said second number being less than said first number, at least one of said ACS modules being associated with a plurality of specific predetermined states of said predetermined state machine model so that one ACS module is associated with each state of said predetermined state machine model, each of said ACS modules associated with a plurality of states of said predetermined state machine model having state memory means;

each of said ACS modules associated with a plurality of states of said predetermined state machine model having means for receiving each of the branch metrics for all input paths to the states associated with the respective ACS module, for adding the same to the corresponding path metrics stored in said ACS modules, for selecting the lowest sum as the surviving path, for storing the new path metric for the surviving path in the ACS module and for storing in said state memory means the state associated with the surviving path.

3. The apparatus of either of claims 1 and 2 wherein each of said ACS modules associated with a plurality of states of said predetermined state machine model are associated only with states selected from a group of states satisfying the criteria that:
(a) from all possible codewords of a predetermined codeword length or less and the respective state sequences, and
(b) from all possible pairs of said codewords of equal length representing error events which have the same starting state but differ in the second state, and from the state sequences for each said pair of said codewords representing error events;
there is a predetermined subset of said error events for which no two states from said group of states are ever simultaneously occupied by the two state sequences from any error event in said predetermined subset of error events at any position in the state sequences.

4. The apparatus of claim 3 wherein error events included in the predetermined set of error events are selected based at least in part on error event distances.

5. The apparatus of claim 4 wherein error events in the predetermined set of error events include minimum distance error events.

6. The apparatus of claim 3 wherein error events in the predetermined set of error events include error events characteristic of non-ideal aspects of the source of the signal to be detected.

7. The apparatus of claim 6 wherein said error events characteristic of non-ideal aspects of the source of the signal to be detected include drop-out and drop-in errors.

8. Apparatus in accordance with either of claims 1 and 2 wherein said predetermined state machine model of said apparatus includes nonlinear behavior of the system providing the signal to be detected.

9. The apparatus of either of claims 1 and 2 wherein each sequence model transition of said predetermined state machine model represents the combination of at least two consecutive sequence model transitions of an underlying state machine model, the totality of all sequence model transitions of said predetermined state machine model representing all possible said consecutive sequence model transitions of the underlying state machine model.

10. The apparatus of claim 9 wherein said predetermined state machine model is as follows

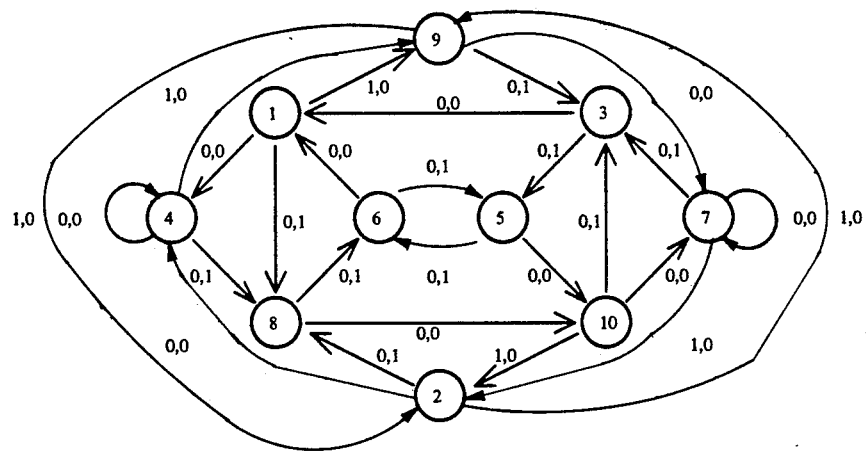

representing the combination of two consecutive sequence model transitions in the following said underlying state machine model;

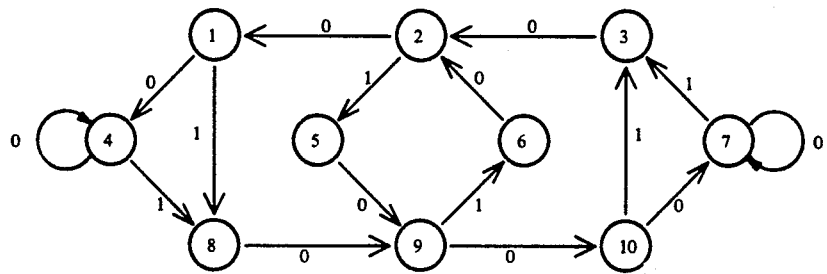

wherein the numbered states may be represented by the following sequences

| State Number | Sequence |
|---|---|
| 1 | 1000 |
| 2 | 1100 |
| 3 | 1110 |
| 4 | 0000 |
| 5 | 1001 |
| 6 | 0110 |
| 7 | 1111 |
| 8 | 0001 |
| 9 | 0011 |
| 10 | 0111 | said second number of ACS modules including first, second, third, fourth and fifth ACS modules, each having a state memory means for storing any one of two states;

said first ACS module being associated with states 5 and 6 of said predetermined state machine model;

said second ACS module being associated with states 1 and 10 of said state machine model;

said third ACS module being associated with states 3 and 8 of said predetermined state machine model;

said fourth ACS module being associated with states 2 and 9 of said state machine model;

said fifth ACS module being associated with states 4 and 7 of said state machine model;

each of said ACS modules having means for receiving each of the branch metrics for all input paths to the states associated with the respective ACS module, for adding the same to the corresponding path metrics stored in said ACS modules, for selecting the lowest sum as the surviving path, for storing the new path metric for the surviving path in said ACS module and for storing in said state memory means the state associated with the surviving path.

11. The sequence detector of claim 10 wherein the expected sample sequence for an isolated medium transition in said underlying state machine model is programmable.

12. The sequence detector of either of claims 1 and 2 wherein the expected sample sequence for an isolated medium transition in said predetermined state machine model is programmable.

13. A method of sequence detection for signals characterized by a predetermined state machine model having a first number of states, comprising the steps of:

(a) associating at least one plurality of specific predetermined ones of the first number of states together;

(b) for any of the first number of states not associated with any other state in step (a), maintaining the path having the lowest path metric of any paths entering that state;

(c) for each plurality of the first number of states associated together in step (a), maintaining (i), the path having the one lowest path metric of any paths entering any of the states associated together, and (ii) the identification of specific state so entered; and, for each signal sample, (d) determining the branch metrics;

(e) adding the path metrics maintained in steps (b) and (c) to the respective branch metrics determined in step (d) to determine new path metrics;

(f) for each of the first number of states not associated with any other state in step (a), causing the new path having the lowest new path metric of any new paths entering that state to be the path maintained in step (b), and for each plurality of the first number of states associated together in step (a), causing (1), the new path having the lowest new path metric of any new paths entering any of the states associated together to be the path maintained in step (c)(i), and (2), the identification of the specific state so entered to be the identification of the specific state maintained in step (c)(ii).

14. The method of sequence detection of claim 13 wherein each of the states associated together in step (a) are states selected from a group of states satisfying the criteria that:

(a) from all possible codewords of a predetermined codeword length or less and the respective state sequences, and (b) from all possible pairs of said codewords of equal length representing error events which have the same starting state but differ in the second state, and from the state sequences for each said pair of said codewords representing error events;

there is a predetermined subset of said error events for which no two states from said group of states are ever simultaneously occupied by the two state sequences from any error event in said predetermined subset of error events at any position in the state sequences.

15. The method of sequence detection of claim 14 wherein error events included in the predetermined set of error events are selected based at least in part on error event distances.

16. The method of sequence detection of claim 15 wherein error events in the predetermined set of error events include minimum distance error events.

17. The method of sequence detection of claim 14 wherein error events in the predetermined set of error events include error events characteristic of non-ideal aspects of the source of the signal to be demodulated.

18. The method of sequence detection of claim 17 wherein said error events characteristic of non-ideal aspects of the source of the signal to be demodulated include drop-out and drop-in errors.

19. A sequence detector for demodulating EPR4 signals with a minimum run length constraint of $d=1$ having the following state machine model with the six states 000, 001, 011, 111, 110 and 100;

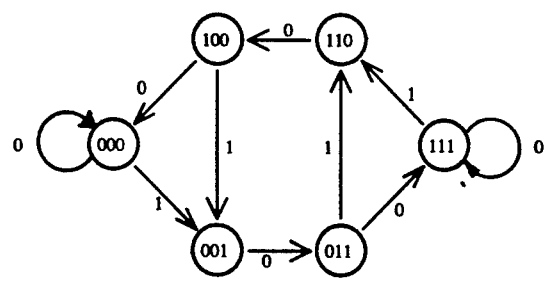

said sequence detector having;

branch metric generator means;

first and second add, compare, select (ACS) modules, each having a state memory means for storing any one of three states;

said first ACS module being associated with states 000, 011 and 110 of said state machine model;

said second ACS module being associated with state 001, 111 and 100 of said state machine model;

said first and second ACS modules each having means for receiving each of the branch metrics for all input paths to the states associated with the respective ACS module, for adding the same to the corresponding path metrics stored in said ACS modules, for selecting the lowest sum as the surviving path, for storing the new path metric for the surviving path in said ACS module and for storing in said state memory means the state associated with the surviving path.

20. A sequence detector for demodulating EPR4 signals with a minimum run length constraint of d=1 having the following state machine model with the six states 000, 001, 011, 111, 110 and 100;

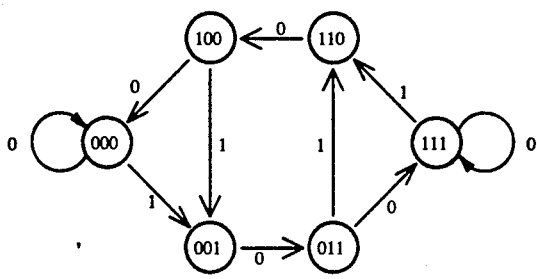

said sequence detector comprising:
 branch metric generator means;
 a plurality of add, compare, select (ACS) modules numbering less than six, at least one of said ACS modules being associated with a plurality of states of said state machine model so that one ACS module is associated with each state of said state machine model, each of said ACS modules associated with a plurality of states of said state machine model having state memory means;
 each said ACS module associated with a plurality of states of said state machine model being associated with states which, taken any two at a time, are directly connected in the following diagram;

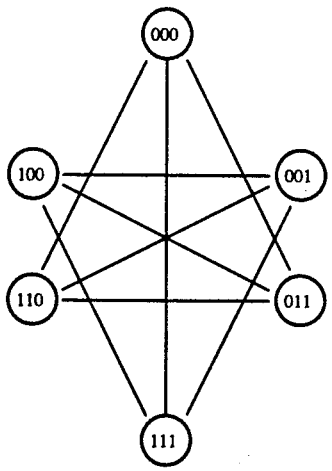

each of said ACS modules associated with a plurality of states of said state machine model having means for receiving each of the branch metrics for all input paths to the states associated with the respective ACS module, for adding the same to the corresponding path metrics stored in said ACS modules, for selecting the lowest sum as the surviving path, for storing the new path metric for the surviving path in the ACS module and for storing in said state memory means the state associated with the surviving path.

21. A sequence detector for demodulating PR4 signals without a minimum run length constraint having the following state machine model with the four states 1, 2, 3 and 4;

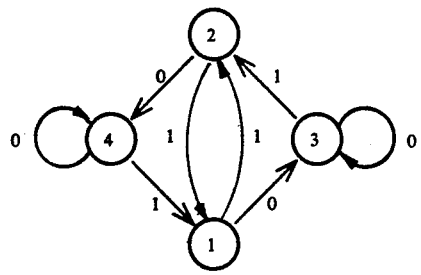

wherein the numbered states may be represented by the following sequences:

| State Number | Sequence |
|---|---|
| 1 | 01 |
| 2 | 10 |
| 3 | 11 |
| 4 | 00 | said sequence detector comprising:
 branch metric generator means;
 first and second add, compare, select (ACS) modules, each having a state memory means for storing any one of two states;
 said first ACS module being associated with states 1 and 2 of said state machine model;
 said second ACS module being associated with states 3 and 4 of said state machine model;
 said first and second ACS modules each having means for receiving each of the branch metrics for all input paths to the states associated with the respective ACS module, for adding the same to the corresponding path metrics stored in said ACS modules, for selecting the lowest sum as the surviving path, for storing the new path metric for the surviving path in said ACS module and for storing in said state memory means the state associated with the surviving path.

22. A sequence detector for demodulating EPR4 signals with a minimum run length constraint of d=1, having the following state machine model with the six states 000, 001, 011, 100, 110 and 111;

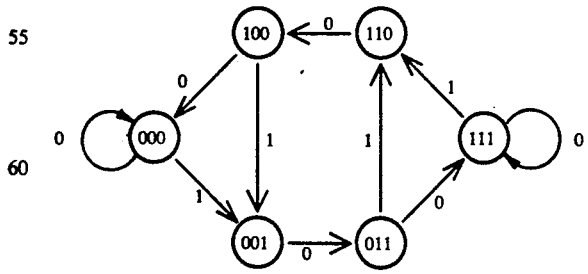

said sequence detector comprising:
 branch metric generator means;
 first and second add, compare, select (ACS) modules, each having a state memory means for storing any one of two states;
third and fourth add, compare, select (ACS) modules;
said first ACS module being associated with states 001 and 100 of said state machine model;
said second ACS module being associated with states 110 and 011 of said state machine model;
said third ACS module being associated with state 000 of said state machine model;
said fourth ACS module being associated with state 111 of said state machine model;
said first and second ACS modules each having means for receiving each of the branch metrics for all input paths to the states associated with the respective ACS module, for adding the same to the corresponding path metrics stored in said ACS modules, for selecting the lowest sum as the surviving path, for storing the new path metric for the surviving path in said ACS module and for storing in said state memory means the state associated with the surviving path;
said third and fourth ACS modules each having means for receiving each of the branch metrics for all input paths to the states associated with the respective ACS module, for adding the same to the corresponding path metrics stored in said ACS modules, for selecting the lowest sum as the surviving path, for storing the new path metric for the surviving path in said ACS module.

23. A sequence detector for demodulating EPR4 signals without a minimum run length constraint, having the following state machine model with the eight states 1 through 8;

a first add, compare, select (ACS) modules having a state memory means for storing any one of two states;
second through seventh add, compare, select (ACS) modules;
said first ACS module being associated with states 011 and 100 of said state machine model;
said second through seventh ACS modules each being associated with a unique one of states 000, 001, 010, 101, 110 and 111 of said state machine model;
said first ACS module having means for receiving each of the branch metrics for all input paths to the states associated with the respective ACS module, for adding the same to the corresponding path metrics stored in said ACS modules, for selecting the lowest sum as the surviving path, for storing the new path metric for the surviving path in said ACS module and for storing in said state memory means the state associated with the surviving path;
said second through seventh ACS modules each having means for receiving each of the branch metrics for all input paths to the states associated with the respective ACS module, for adding the same to the corresponding path metrics stored in said ACS modules, for selecting the lowest sum as the surviving path, for storing the new path metric for the surviving path in said ACS module.

24. A sequence detector comprising:
means for demodulating signals with a minimum run length constraint of $d=1$ having the following state machine model with the ten states 1 through 10;

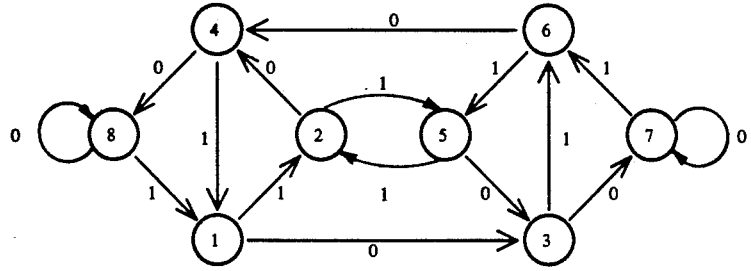

wherein the numbered states may be represented by the following sequences:

| State Number | Sequence |
|---|---|
| 1 | 001 |
| 2 | 010 |
| 3 | 011 |
| 4 | 100 |
| 5 | 101 |
| 6 | 110 |
| 7 | 111 |
| 8 | 000 |

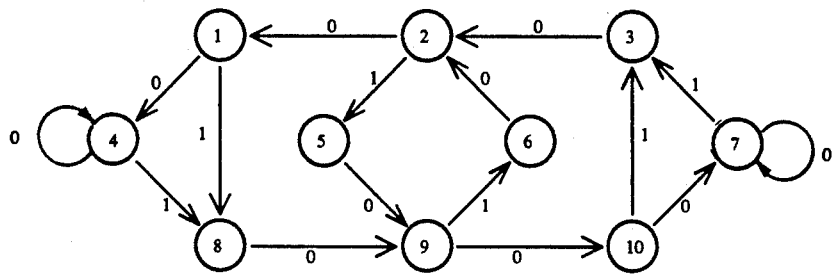

said sequence detector comprising:
branch metric generator means;

wherein the numbered states may be represented by the following sequences

| State Number | Sequence |
| --- | --- |
| 1 | 1000 |
| 2 | 1100 |
| 3 | 1110 |
| 4 | 0000 |
| 5 | 1001 |
| 6 | 0110 |
| 7 | 1111 |
| 8 | 0001 |
| 9 | 0011 |
| 10 | 0111 | tive ACS module, for adding the same to the corresponding path metrics stored in said ACS modules, for selecting the lowest sum as the surviving path, for storing the new path metric for the surviving path in the ACS module and for storing in said state memory means the state associated with the surviving path.

25. A sequence detector comprising:

means for demodulating signals with a minimum run length constraint of d=1 having the following state machine model with the ten states 1 through 10;

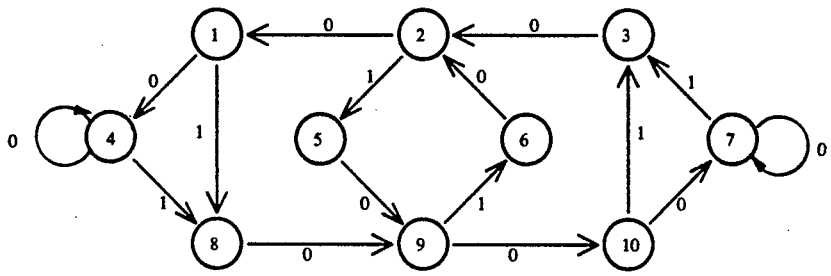

said means for detecting signals having;
  branch metric generator means;
  a plurality of add, compare, select (ACS) modules numbered less than ten, at least one of said ACS modules being associated with a plurality of states of said state machine model so that one ACS module is associated with each state of said state machine model, each of said ACS modules associated with a plurality of states of said state machine model having state memory means;
  each said ACS module associated with a plurality of states of said state machine model being associated with states which, taken any two at a time, are directly connected in the following diagram;

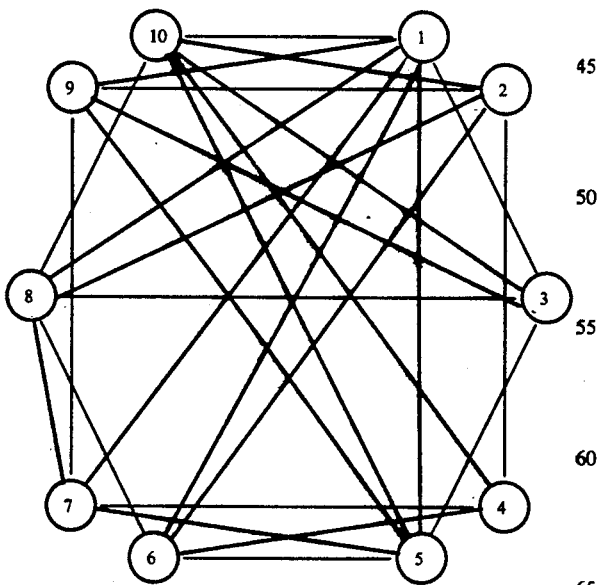

each of said ACS modules associated with a plurality of states of said state machine model having means for receiving each of the branch metrics for all input paths to the states associated with the respecwherein the numbered states may be represented by the following sequences

| State Number | Sequence |
| --- | --- |
| 1 | 1000 |
| 2 | 1100 |
| 3 | 1110 |
| 4 | 0000 |
| 5 | 1001 |
| 6 | 0110 |
| 7 | 1111 |
| 8 | 0001 |
| 9 | 0011 |
| 10 | 0111 | said means for detecting signals having;
  branch metric generator means;
  a plurality of add, compare, select (ACS) modules numbering less than ten, at least one of said ACS modules being associated with a plurality of states of said state machine model so that one ACS module is associated with each state of said state machine model, each of said ACS modules associated with a plurality of states of said state machine model having state memory means;
  each said ACS module associated with a plurality of states of said state machine model being associated with states which, taken any two at a time, are directly connected in the following diagram;

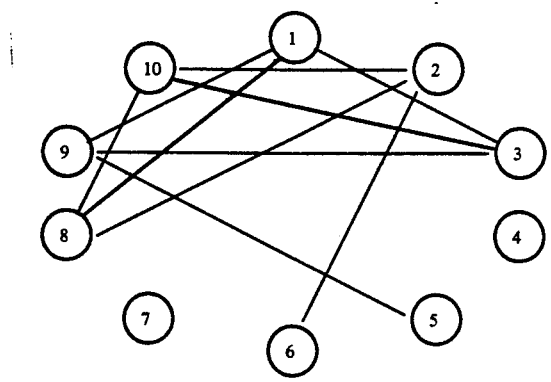

each of said ACS modules associated with a plurality of states of said state machine model having means for receiving each of the branch metrics for all input paths to the states associated with the respective ACS module, for adding the same to the corresponding path metrics stored in said ACS modules, for selecting the lowest sum as the surviving path, for storing the new path metric for the surviving path in the ACS module and for storing in said state memory means the state associated with the surviving path.

26. A sequence detector comprising:

means for demodulating partial response signals with a minimum run length constraint of d=1 having the following predetermined state machine model with the ten states 1 through 10;

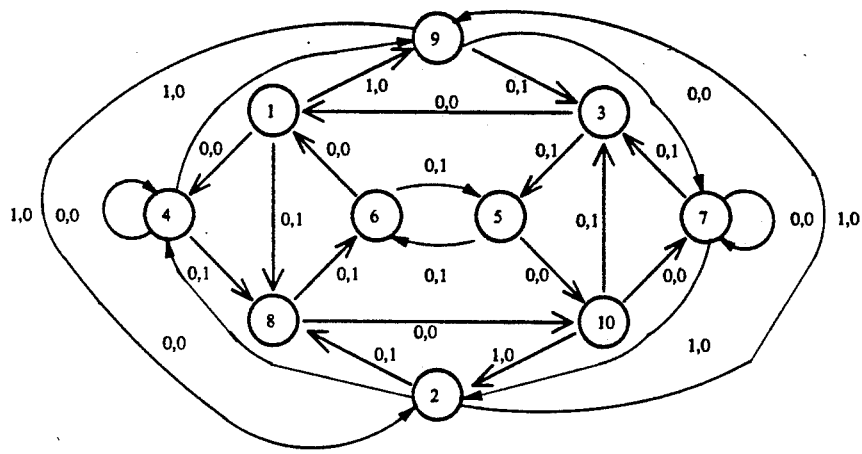

wherein the numbered states may be represented by the following sequences

| State Number | Sequence |
|---|---|
| 1 | 1000 |
| 2 | 1100 |
| 3 | 1110 |
| 4 | 0000 |
| 5 | 1001 |
| 6 | 0110 |
| 7 | 1111 |
| 8 | 0001 |
| 9 | 0011 |
| 10 | 0111 | said sequence detector having;
  branch metric generator means;
  first, second, third, fourth and fifth add, compare, select (ACS) modules, each having a state memory means for storing any one of two states;
  said first ACS module being associated with states 5 and 6 of said predetermined state machine model;
  said second ACS module being associated with states 1 and 10 of said state machine model;
  said third ACS module being associated with states 3 and 8 of said predetermined state machine model;
  said fourth ACS module being associated with states 2 and 9 of said state machine model;
  said fifth ACS module being associated with states 4 and 7 of said state machine model;
  each of said ACS modules having means for receiving each of the branch metrics for all input paths to the states associated with the respective ACS module, for adding the same to the corresponding path metrics stored in said ACS modules, for selecting the lowest sum as the surviving path, for storing the new path metric for the surviving path in said ACS module and for storing in said state memory means the state associated with the surviving path;
  thereby having the following shared state machine model

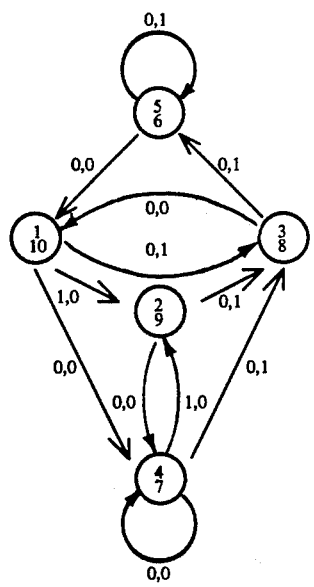

27. The sequence detector of claim 26 wherein the expected sample sequence for an isolated medium transition in said underlying state machine model is programmable.

28. A sequence detector comprising:

means for demodulating partial response signals with a minimum run length constraint of d=1 having the following predetermined state machine model with the ten states 1 through 10;

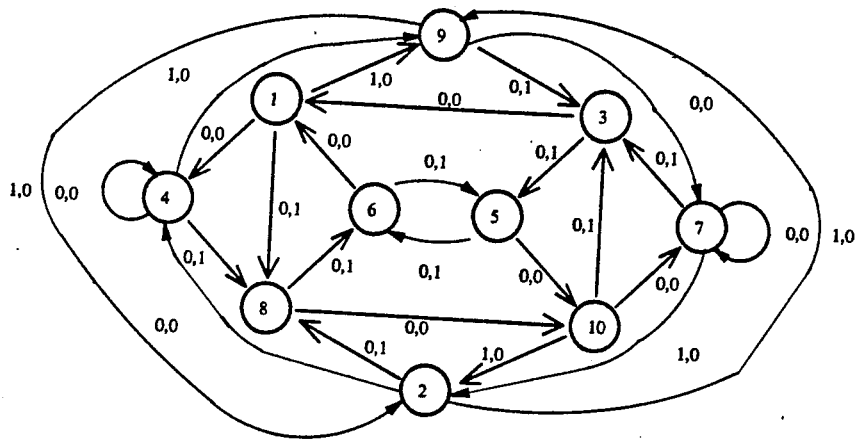

wherein the numbered states may be represented by the following sequences

| State Number | Sequence |
|---|---|
| 1 | 1000 |
| 2 | 1100 |
| 3 | 1110 |
| 4 | 0000 |
| 5 | 1001 |
| 6 | 0110 |
| 7 | 1111 |
| 8 | 0001 |
| 9 | 0011 |
| 10 | 0111 | said sequence demodulating having;
 branch metric generator means;
 a first add, compare, select (ACS) module having a state memory means for storing any one of four states;
 second and third add, compare, select (ACS) modules, each having a state memory means for storing any one of three states;
 said first ACS module being associated with states 1, 3, 8 and 10 of said predetermined state machine model;
 said second ACS module being associated with states 2, 4 and 6 of said state machine model;
 said third ACS module being associated with states 5, 7 and 9 of said predetermined state machine model;
 each of said ACS modules having means for receiving each of the branch metrics for all input paths to the states associated with the respective ACS module, for adding the same to the corresponding path metrics stored in said ACS modules, for selecting the lowest sum as the surviving path, for storing the new path metric for the surviving path in said ACS module and for storing in said state memory means the state associated with the surviving path.

29. The sequence demodulator of claim 28 wherein the expected sample sequence for an isolated medium transition in said underlying state machine model is programmable.

* * * * *